US009496686B2

(12) United States Patent
Suzuki et al.

(10) Patent No.: US 9,496,686 B2
(45) Date of Patent: Nov. 15, 2016

(54) SURFACE-EMITTING LASER ELEMENT, METHOD FOR MANUFACTURING A SURFACE-EMITTING LASER ELEMENT, AND ATOMIC OSCILLATOR

(71) Applicants: Ryoichiro Suzuki, Miyagi (JP); Shunichi Sato, Miyagi (JP)

(72) Inventors: Ryoichiro Suzuki, Miyagi (JP); Shunichi Sato, Miyagi (JP)

(73) Assignee: RICOH COMPANY, LTD., Tokyo (JP)

(*) Notice: Subject to any disclaimer, the term of this patent is extended or adjusted under 35 U.S.C. 154(b) by 0 days.

(21) Appl. No.: 14/357,804

(22) PCT Filed: Nov. 29, 2012

(86) PCT No.: PCT/JP2012/081582
§ 371 (c)(1),
(2) Date: May 13, 2014

(87) PCT Pub. No.: WO2013/081176
PCT Pub. Date: Jun. 6, 2013

(65) Prior Publication Data
US 2014/0354367 A1    Dec. 4, 2014

(30) Foreign Application Priority Data

Dec. 2, 2011 (JP) ................. 2011-264908
Oct. 23, 2012 (JP) ................. 2012-234113

(51) Int. Cl.
*H01S 5/00* (2006.01)
*H01S 5/187* (2006.01)
(Continued)

(52) U.S. Cl.
CPC ............... *H01S 5/187* (2013.01); *B82Y 20/00* (2013.01); *G04F 5/145* (2013.01); *H01S 5/0421* (2013.01);
(Continued)

(58) Field of Classification Search
CPC .............. B82Y 20/00; H03L 7/26; H01S 5/18358; H01S 5/34313; H01S 5/4087;
(Continued)

(56) References Cited

U.S. PATENT DOCUMENTS 7,684,458 B2    3/2010  Sato et al.
7,693,204 B2    4/2010  Sato et al.
(Continued)

FOREIGN PATENT DOCUMENTS

EP    1483778 B1    4/2011
JP    09-135051     5/1997
(Continued)

OTHER PUBLICATIONS

International Search Report Issued Feb. 5, 2013 in PCT/JP2012/081582 Filed on Nov. 29, 2012.
(Continued)

*Primary Examiner* — Yuanda Zhang
(74) *Attorney, Agent, or Firm* — Cooper & Dunham LLP

(57) ABSTRACT

Disclosed is a surface-emitting laser element including a semiconductor substrate and plural surface-emitting lasers configured to emit light mutually different wavelengths, each surface-emitting laser including a lower Bragg reflector provided on the semiconductor substrate, a resonator provided on the lower Bragg reflector, an upper Bragg reflector provided on the resonator, and a wavelength adjustment layer provided in the upper Bragg reflector or lower Bragg reflector, the wavelength adjustment layers included in the surface-emitting lasers having mutually different thicknesses, at least one of the wavelength adjustment layers including adjustment layers made of two kinds of materials, and numbers of the adjustment layers included in the wavelength adjustment layers being mutually different.

14 Claims, 23 Drawing Sheets

(51) Int. Cl.
| | |
|---|---|
| *H01S 5/343* | (2006.01) |
| *H01S 5/40* | (2006.01) |
| *H01S 5/42* | (2006.01) |
| *G04F 5/14* | (2006.01) |
| *B82Y 20/00* | (2011.01) |
| *H01S 5/34* | (2006.01) |
| *H03B 17/00* | (2006.01) |
| *H03L 7/26* | (2006.01) |
| *H01S 5/042* | (2006.01) |
| *H01S 5/183* | (2006.01) |
| *H01S 5/026* | (2006.01) |
| *H01S 5/20* | (2006.01) |

(52) U.S. Cl.
CPC ......... *H01S 5/18358* (2013.01); *H01S 5/3407* (2013.01); *H01S 5/34313* (2013.01); *H01S 5/4087* (2013.01); *H01S 5/42* (2013.01); *H01S 5/423* (2013.01); *H03B 17/00* (2013.01); *H03L 7/26* (2013.01); *H01S 5/026* (2013.01); *H01S 5/18311* (2013.01); *H01S 5/18341* (2013.01); *H01S 5/18344* (2013.01); *H01S 5/18369* (2013.01); *H01S 5/2086* (2013.01); *H01S 5/34373* (2013.01); *H01S 2301/166* (2013.01); *H01S 2301/176* (2013.01)

(58) Field of Classification Search
CPC ................... H01S 5/423; H01S 5/0421; H01S 5/187; H01S 5/3407; H01S 5/42; H01S 5/18341; H01S 5/18369; H01S 5/026; H01S 5/18344; H01S 5/2086; G04F 5/145; H03B 17/00
See application file for complete search history.

(56) References Cited

U.S. PATENT DOCUMENTS

| | | | |
|---|---|---|---|
| 7,720,125 B2 | 5/2010 | Jikutani et al. | |
| 7,746,912 B2 | 6/2010 | Motomura et al. | |
| 7,957,444 B2 | 6/2011 | Itoh et al. | |
| 7,978,739 B2 | 7/2011 | Sugawara et al. | |
| 7,981,700 B2 | 7/2011 | Sato et al. | |
| 8,035,676 B2 | 10/2011 | Harasaka et al. | |
| 8,089,498 B2 | 1/2012 | Sato et al. | |
| 8,111,725 B2 | 2/2012 | Ishii et al. | |
| 8,179,414 B2 | 5/2012 | Sato et al. | |
| 8,208,511 B2 | 6/2012 | Sato et al. | |
| 8,416,822 B2 | 4/2013 | Shouji et al. | |
| 8,421,837 B2 | 4/2013 | Itoh et al. | |
| 8,441,511 B2 | 5/2013 | Harasaka et al. | |
| 8,483,254 B2 | 7/2013 | Harasaka et al. | |
| 8,498,319 B2 | 7/2013 | Shouji et al. | |
| 8,502,852 B2 | 8/2013 | Numata et al. | |
| 8,594,146 B2 | 11/2013 | Jikutani et al. | |
| 8,609,447 B2 | 12/2013 | Shouji et al. | |
| 8,624,950 B2 | 1/2014 | Jikutani et al. | |
| 8,675,271 B2 | 3/2014 | Jikutani et al. | |
| 2002/0131464 A1 | 9/2002 | Sirbu et al. | |
| 2005/0100068 A1* | 5/2005 | Jikutani | B82Y 20/00 372/46.01 |
| 2008/0055672 A1 | 3/2008 | Watanabe et al. | |
| 2009/0295902 A1 | 12/2009 | Sato et al. | |
| 2011/0037825 A1 | 2/2011 | Jikutani et al. | |
| 2011/0109395 A1 | 5/2011 | Chindo | |
| 2011/0116147 A1 | 5/2011 | Motomura et al. | |
| 2011/0128343 A1 | 6/2011 | Sato et al. | |
| 2011/0176122 A1 | 7/2011 | Kaminishi et al. | |
| 2011/0228035 A1 | 9/2011 | Ishii et al. | |
| 2012/0251182 A1 | 10/2012 | Adachi et al. | |
| 2012/0294652 A1 | 11/2012 | Itoh et al. | |

FOREIGN PATENT DOCUMENTS

| | | |
|---|---|---|
| JP | 2751844 | 5/1998 |
| JP | 11-330631 | 11/1999 |
| JP | 2000-058958 | 2/2000 |
| JP | 2000-244067 | 9/2000 |
| JP | 2000-294873 | 10/2000 |
| JP | 2006-351692 | 12/2006 |
| JP | 2008-053353 | 3/2008 |
| JP | 2008-283129 | 11/2008 |
| JP | 2009-188598 | 8/2009 |
| JP | 2011-108678 | 6/2011 |
| WO | 2011/148957 A1 | 12/2011 |
| WO | 2012/124821 A1 | 9/2012 |

OTHER PUBLICATIONS

Knappe et al., "A microfabricated atomic clock," Appl. Phys. Lett., vol. 85, No. 9, pp. 1460-1462 (2004).
S. Knappe, "MEMS Atomic Clocks," Comprehensive Microsystems, vol. 3, pp. 571-612.
D. K. Serkland et al., "VCSELs for Atomic Clocks" Proc. of SPIE vol. 6132, pp. 613208-1-613208-11 (2006).
Apr. 16, 2015 European search report in corresponding European patent application No. 12854434.3.
Chang-Hasnain et al., "Multiple Wavelength Tunable Surfacae-Emitting Laser Arrays", IEEE Journal of Quantum Electronics, Jun. 1991, pp. 1368-1376, vol. 27.
T. Wipiejewski et al., "Multiple wavelength vertical-cavity laser array employing molecular beam epitaxy regrowth", Electronic Letters, Feb. 15, 1996, pp. 340-342, vol. 32.
Babu Dayal et al., "Multiple-Wavelength Vertical-Cavity Surface-Emitting Lasers by Grading a Spacer Layer for Short-Reach Wavelength Division Multiplexing Applications", Applied Physics Express, Sep. 1, 2009, vol. 2.
Svenja Knappe, "MEMS Atomic Clocks", Comprehensive Microsystems, 2008, pp. 571-612, vol. 3, Elsevier B.V.
Russian official action (and English translation thereof) dated Aug. 10, 2015 in corresponding Russian Patent Application No. 2014121933.

* cited by examiner

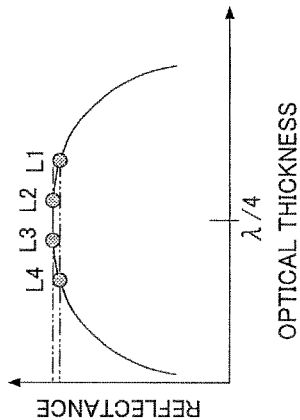
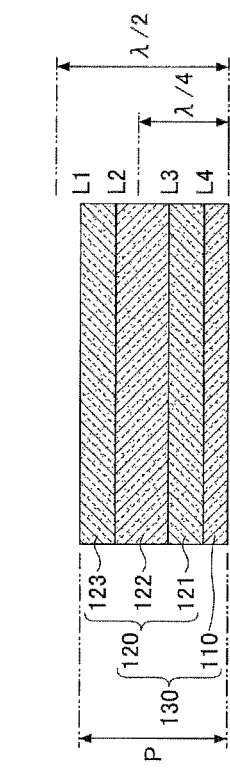
FIG.4A
FIG.4B

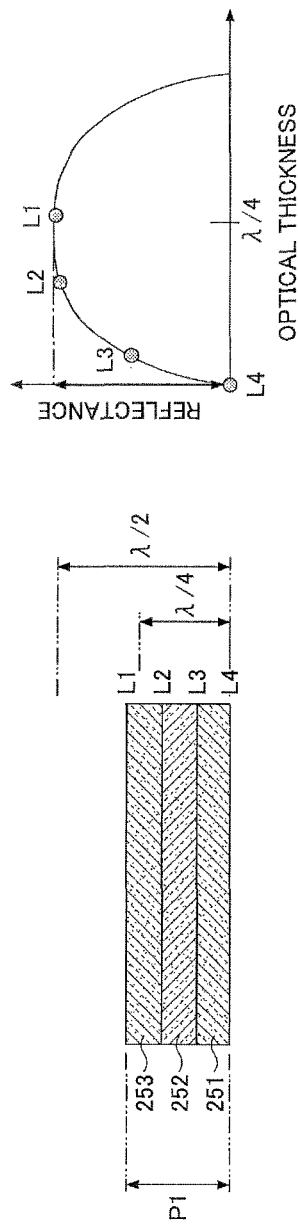

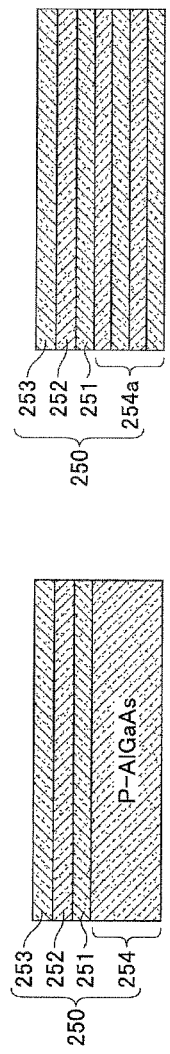

SURFACE-EMITTING LASER ELEMENT, METHOD FOR MANUFACTURING A SURFACE-EMITTING LASER ELEMENT, AND ATOMIC OSCILLATOR

TECHNICAL FIELD

At least one aspect of the present invention may relate to at least one of a surface-emitting laser element, a method for manufacturing a surface-emitting laser element, and an atomic oscillator.

BACKGROUND ART

A surface-emitting laser (VCSEL: Vertical Cavity Surface Emitting LASER) is a semiconductor laser for emitting light in a vertical direction with respect to a surface of a substrate, and has features of being at a low price, a low electrical power consumption, compact, having a high performance, and being readily integrated two-dimensionally, as compared with an edge-emitting-type semiconductor laser.

A surface-emitting laser has a resonator area including an active layer and a resonator structure composed of an upper reflector and a lower reflector above and below the resonator area, respectively (for example, Japanese Patent Application Publication No 2008-53353). Hence, a resonator area is formed with a predetermined optical thickness in such a manner that light with a wavelength $\lambda$ oscillates in the resonator area in order to obtain light with an oscillation wavelength $\lambda$. An upper reflector and a lower reflector are formed by alternately laminating and forming materials with different refractive indices, namely, a low refractive index material and a high refractive index material, and formed in such a manner that optical film thicknesses of the low refractive index material and high refractive index material are $\lambda/4$ in order to obtain a high reflectance at a wavelength $\lambda$.

Furthermore, forming elements for different wavelengths in a chip is also disclosed (for example, Japanese Patent No. 2751814, Japanese Patent Application Publication No. 2000-058958, Japanese Patent Application Publication No. 11-330631, and Japanese Patent Application Publication No. 2008-283129). It may be possible to form such a multi-wavelength surface-emitting laser element by forming a wavelength adjustment layer with a structure formed by alternately laminating two materials for different etching fluids on a resonator area of the surface-emitting laser element and by removing such a wavelength adjustment layer one-by-one for each surface-emitting laser by means of wet-etching to change a thickness of the wavelength adjustment layer.

Meanwhile, there is an atomic clock (atomic oscillator) as a clock for timing extremely accurate time, and a technique for miniaturizing such an atomic clock, etc., is studied. An atomic clock is an oscillator based on an amount of transition energy of an electron constituting an alkali metal atom, etc., and in particular, it may be possible to a very precise value of transition energy of an electron in an alkali metal atom on a condition of no disturbance whereby it may be possible to obtain a frequency stability at several orders of magnitude higher than a quartz oscillator.

There are some types of such an atomic clock, and among those, a frequency stability of a Coherent Population Trapping (CPT)—type atomic clock is about three orders of magnitude higher than a conventional quartz oscillator, wherein it may also be possible to expect a very compact type and very low electric power consumption (for example, Applied Physics Letters, Vol. 85, pp. 1460-1462 (2004), Comprehensive Microsystems, vol. 3, pp. 571-612, and Japanese Patent Application Publication No. 2009-188598).

A CPT-type atomic clock has a laser element, a cell enclosing an alkali metal, and a light receiving element for light-receiving laser light transmitted through the cell, wherein laser light is modulated and two transitions of en electron in an alkali metal atom are simultaneously attained by sideband wavelengths occurring at both sides of a carrier wave at a particular wavelength to conduct excitation thereof. Transition energy for such transition is invariable, and when a sideband wavelength of laser light coincides with a wavelength corresponding to transition energy, a transparency increasing phenomenon occurs in which a light absorption rate of an alkali metal is lowered. Thus, such an atomic clock is characterized in that a wavelength of a carrier wave is adjusted to lower a light absorption rate of an alkali metal and a signal detected by a light receiving element is fed back to a modulator so that a modulation frequency of laser light from a laser element is adjusted by the modulator. Additionally, in such an atomic clock, laser light emitted from a laser element irradiates a cell enclosing an alkali metal through a collimator and a $\lambda/4$ wave plate.

For a light source for such a very compact type atomic clock, a compact surface emitting laser with a very low electric power consumption and a high wavelength quality is suitable and it is desired that a precision of a wavelength of a carrier wave is in ±1 nm with respect to a particular wavelength (for example, Proc. of SPIE Vol. 6132 613208-1 (2006)).

Meanwhile, when a surface-emitting laser element is used for an atomic clock, it may be necessary to provide a narrow wavelength interval (5 nm) for each surface-emitting laser. Hence, a wavelength adjustment layer is formed on a resonator area of a surface-emitting laser, and accordingly, when such a surface-emitting laser with a narrow wavelength interval is formed, it may be necessary to form a film in such a manner that a thickness of each film in the wavelength adjustment layer is very thin. However, it may be difficult to form a film in such a manner that a thickness of each film for forming a wavelength adjustment layer is extremely thin and uniform, due to a dispersion of a growth rate, an irregularity in a film thickness distribution, etc., at time of forming of a semiconductor layer.

Specifically, as indicated in Japanese Patent No. 2751814, when a wavelength adjustment layer is formed on a resonator area and when an interval of an oscillating wavelength is intended to be 5 nm or less, it may be necessary for a film thickness of a wavelength adjustment layer to be 1.2 nm or less but it may be extremely difficult for a current technique of crystal growth of a compound semiconductor to control such a thin film thickness. Thus, even if a film thickness is changed slightly, an oscillation wavelength may be influenced thereby.

DISCLOSURE OF THE INVENTION

According to one aspect of the present invention, there may be provided a surface-emitting laser element including a semiconductor substrate and plural surface-emitting lasers configured to emit light with mutually different wavelengths, each surface-emitting laser including a lower Bragg reflector provided on the semiconductor substrate, a resonator provided on the lower Bragg reflector, an upper Bragg reflector provided on the resonator, and a wavelength adjustment layer provided in the upper Bragg reflector or lower Bragg reflector, the wavelength adjustment layers included in the surface-emitting lasers having mutually different thicknesses, at least one of the wavelength adjustment layers including adjustment layers made of two kinds of materials, and numbers of the adjustment layers included in the wavelength adjustment layers being mutually different.

According to another aspect of the present invention, there may be provided a method for manufacturing a surface-emitting laser element including plural surface-emitting lasers configured to emit light with mutually different wavelengths, including steps of forming a lower Bragg reflector on a semiconductor substrate, forming a resonator on the lower Bragg reflector, forming an upper Bragg reflector on the resonator, laminating adjustment layers made of two kinds of materials in the upper Bragg reflector or lower Bragg reflector to form a wavelength adjustment layer, removing one adjustment layer in the wavelength adjustment layer by using a first etching fluid, and removing another adjustment layer in the wavelength adjustment layer by using a second etching fluid different from the first etching fluid, so that the wavelength adjustment layers included in the surface-emitting lasers have mutually different thicknesses and numbers of the adjustment layers included in the wavelength adjustment layers are mutually different.

According to another aspect of the present invention, there may be provided an atomic oscillator including the surface-emitting laser element as described above, an alkali metal cell including an alkali metal to be irradiated with light emitted from the surface-emitting laser element, a photodetector configured to detect light having transmitted through the alkali metal cell, and a controller configured to control an oscillation frequency of the surface-emitting laser element based on light detected by the photodetector.

BRIEF DESCRIPTION OF THE DRAWING(S)

FIG. 4A and FIG. 4B are illustration diagrams (1) of a wavelength adjustment layer of a surface-emitting laser element in a first embodiment.

FIG. 17A and FIG. 17B are illustration diagrams (1) of a first wavelength adjustment layer of a surface-emitting laser element in a third embodiment.

FIG. 19A and FIG. 19B are illustration diagrams (3) of a first wavelength adjustment layer of a surface-emitting laser element in a third embodiment.

AN EMBODIMENT(S) FOR IMPLEMENTING THE INVENTION

Figure 1:
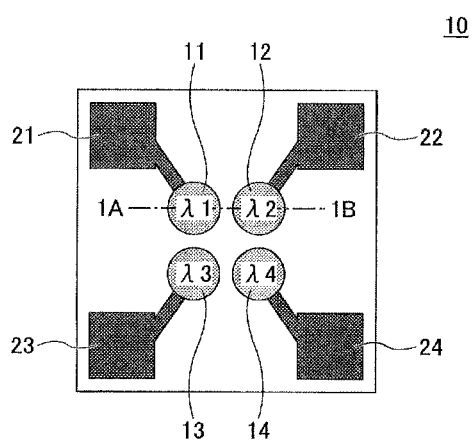
FIG. 1 is a top view of a surface-emitting laser element in a first embodiment.

An embodiment(s) of the present invention will be described below. Additionally, an identical reference numeral will be applied to an identical member, etc., and a description(s) thereof will be omitted.

[First Embodiment]

(A Structure of a Surface-Emitting Laser Element)

Figure 2:
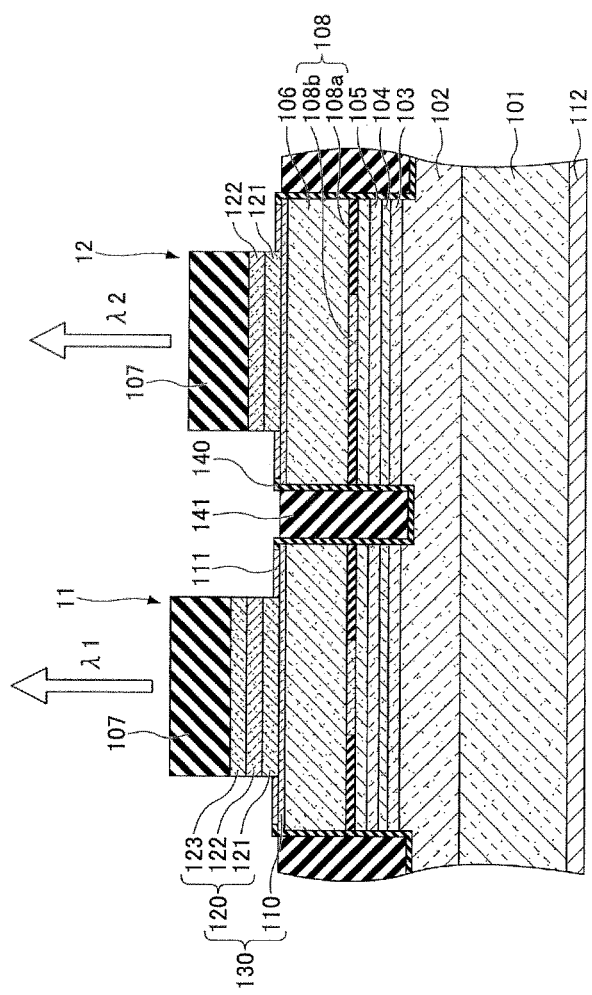
FIG. 2 is an illustration diagram of a surface-emitting laser element in a first embodiment.

A surface-emitting laser element in a first embodiment will be described. As illustrated in FIG. 1 and FIG. 2A, a surface-emitting laser element 10 in the present embodiment has plural surface-emitting lasers, and specifically, has a first surface-emitting laser 11, a second surface-emitting laser 12, a third surface-emitting laser 13, and a fourth surface-emitting laser 14. Additionally, FIG. 1 has been simplified for the sake of an explanation of the present embodiment, wherein depiction of a contact layer, etc., has been omitted conveniently. Furthermore, FIG. 2 is a cross-section diagram provided by cutting along a dashed dotted line 1A-1B in FIG. 1.

The surface-emitting laser element 10 in the present embodiment is formed on a 300 μm square semiconductor chip, wherein each of the first surface-emitting laser 11, second surface-emitting laser 12, third surface-emitting laser 13, and fourth surface-emitting laser 14 formed on such a semiconductor chip is connected to an electrode pad provided to correspond thereto. Specifically, an electrode pad 21 is connected to the first surface-emitting laser 11 and an electrode pad 22 is connected to the second surface-emitting laser 12 while an electrode pad 23 is connected to the third surface-emitting laser 13 and an electrode pad 24 is connected to the fourth surface-emitting laser 14.

Furthermore, the first surface-emitting laser 11, the second surface-emitting laser 12, the third surface-emitting laser 13, and the fourth surface-emitting laser 14 provide emitted light with mutually different wavelengths. Namely, a wavelength λ1 emitted from the first surface-emitting laser 11, a wavelength λ2 emitted from the second surface-emitting laser 12, a wavelength λ3 emitted from the third surface-emitting laser 13, and a wavelength λ4 emitted from the fourth surface-emitting laser 14 are mutually different wavelengths.

Additionally, the surface-emitting laser element in the present embodiment is to obtain a surface-emitting laser with an oscillation wavelength of 894.6 nm, wherein four surface-emitting lasers are formed on a 300 μm square semiconductor chip (substrate). Because it may be possible to form plural surface-emitting lasers in a narrow area in a surface-emitting laser element, there is little change in a position of light emission point even when a surface-emitting laser to conduct light emission is switched. Therefore, a size of a substrate is a size of 500 μm×500 μm or less, whereby adjustment of an optical axis, etc., may be unnecessary or extremely facilitated.

For the surface-emitting laser element in the present embodiment, semiconductor materials with different refractive indices are alternately laminated onto and formed on a substrate 101 made of a semiconductor, etc., to form a lower Bragg reflector 102, and a lower spacer layer 103, an active layer 104, and an upper spacer layer 105 are formed on the lower Bragg reflector 102. A first upper Bragg reflector 106, a contact layer 110, a wavelength adjustment area 120, and a second upper Bragg reflector 107 are formed on the upper spacer layer 105. Furthermore, an upper electrode 111 is formed on and connected to the contact layer 110 and a lower electrode 112 is formed on a back face of the substrate 101. Although a wavelength adjustment layer 130 is composed of the contact layer 110 and the wavelength adjustment area 120 in the present embodiment, the wavelength adjustment layer 130 may be composed of only the wavelength adjustment area 120 in a case where the contact layer 110 is not formed adjacent to the wavelength adjustment area 120. Additionally, the lower Bragg reflector 102, lower spacer layer 103, active layer 104, upper spacer layer 105, first upper Bragg reflector 106, contact layer 110, and wavelength adjustment area 120 which are semiconductor layers formed on the substrate 101 are formed by epitaxially growing semiconductor materials. Specifically, such semiconductor layers are formed by epitaxial growth in Metal Organic Chemical Vapor Deposition (MOCVD) or Molecular Beam Epitaxy (MBE). Additionally, a Bragg reflector as described in the specification for the present application may be described as a distributed Bragg reflector (DBR).

Furthermore, the second upper Bragg reflector 107 is formed on the wavelength adjustment layer 130 for each surface-emitting laser. The second upper Bragg reflector 107 is a dielectric film made of an oxide, nitride, fluoride, etc., and formed by alternately laminating and forming a high refractive index material film(s) and a low refractive index material film(s). Additionally, an upper Bragg reflector is composed of the first upper Bragg reflector 106, the wavelength adjustment layer 130, and the second upper Bragg reflector 107 in the present embodiment. Furthermore, the wavelength adjustment layer 130 may be formed inside the lower Bragg reflector 102.

Figure 3:
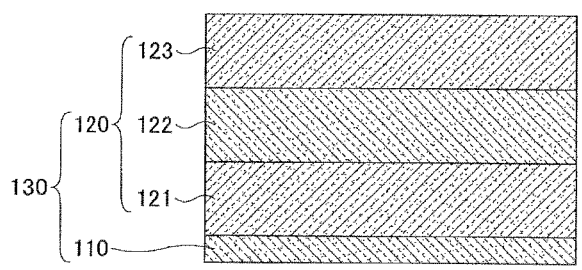
FIG. 3 is a structural diagram of a wavelength adjustment layer of a surface-emitting laser element in a first embodiment.

In the surface-emitting laser element in the present embodiment, thicknesses of the wavelength adjustment areas 120 in the wavelength adjustment layers 130 in the first surface-emitting laser 11, second surface-emitting laser 12, third surface-emitting laser 13, and fourth surface-emitting laser 14 are different therefrom. Specifically, as illustrated in FIG. 3, the wavelength adjustment area 120 is formed on the contact layer 110 wherein the wavelength adjustment area 120 is composed of a first adjustment layer 121, a second adjustment layer 122, and a third adjustment layer 123. In the present embodiment, the first adjustment layer 121 and the third adjustment layer 123 are made of GaInP while the second adjustment layer 122 is made of GaAsP. Additionally, materials for making the first adjustment layer 121, second adjustment layer 122, and third adjustment layer 123 may be opposite thereof.

Thus, thicknesses of the wavelength adjustment areas 120 in the first surface-emitting laser 11, second surface-emitting laser 12, third surface-emitting laser 13, and fourth surface emitting laser 14 are different in the surface-emitting laser element in the present embodiment.

Specifically, the first adjustment layer 121, the second adjustment layer 122, and the third adjustment layer 123 are formed on the wavelength adjustment area 120 in the first surface-emitting laser 11, wherein light with a wavelength of λ1 is emitted which corresponds to a thickness of the wavelength adjustment layer 130 which is a sum of such a wavelength adjustment area 120 and the contact layer 110.

Furthermore, the first adjustment layer 121 and the second adjustment layer 122 are formed in the wavelength adjustment area 120 in the second surface-emitting laser 12, wherein light with a wavelength of λ2 is emitted which corresponds to a thickness of the wavelength adjustment layer 130 which is a sum of such a wavelength adjustment area 120 and the contact layer 110.

Furthermore, the first adjustment layer 121 is formed in the wavelength adjustment area 120 in the third surface-emitting laser 13, wherein light with a wavelength of λ3 is emitted which corresponds to a thickness of the wavelength adjustment layer 130 which is a sum of such a wavelength adjustment area 120 and the contact layer 110.

Furthermore, the wavelength adjustment area 120 is not formed in the fourth surface-emitting laser 14, and hence, light with a wavelength of)λ4 is emitted which corresponds to a thickness of the wavelength adjustment layer 130 which is equal to a thickness of the contact layer 110.

Thus, it may be possible to change thicknesses of the wavelength adjustment layers 130 in the first surface-emitting laser 11, second surface-emitting laser 12, third surface-emitting laser 13, and fourth surface-emitting laser 14 little by little, and it may be possible to emit light with each wavelength corresponding to a thickness of at least one or each of the wavelength adjustment layers 130.

(A Method for Manufacturing a Surface-Emitting Laser Element)

In the present embodiment, an n-GaAs substrate is used for the substrate 101. Furthermore, the lower Bragg reflector 102 is formed by laminating 35.5 pairs of an n-$Al_{0.1}Ga_{0.9}As$ high refractive index layer and n-$Al_{0.9}Ga_{0.1}As$ low refractive index layer in such a manner that an optical film thickness of each layer is λ/4.

The active layer 104 composed of a GaInAs quantum well layer/a GaInPAs barrier layer is formed on the lower Bragg reflector 102 through the lower spacer layer 103 made of $Al_{0.2}Ga_{0.8}As$. The upper spacer layer 105 made of $Al_{0.2}Ga_{0.8}As$ and the first upper Bragg reflector 106 are formed on the active layer 104. Additionally, a resonator area provided with an optical thickness of one wavelength is composed of the lower spacer layer 103, the active layer 104, and the upper spacer layer 105.

The first upper Bragg reflector 106 is formed by laminating 6 pairs of an n-$Al_{0.1}Ga_{0.9}As$ high refractive index layer and an n-$Al_{0.9}Ga_{0.1}As$ low refractive index layer in such a manner that an optical film thickness of each layer is $\lambda/4$. One of the low refractive index layers of the first upper Bragg reflector 106 is composed of an electric current narrowing layer 108 made of AlAs, wherein a peripheral portion of the electric current narrowing layer 108 is selectively oxidized to form a selective oxidation area 108a and an unoxidized electric current narrowing area 108b is formed on a central portion thereof.

The contact layer 110 made of p-GaAs, and the wavelength adjustment area 120 composed of the first adjustment layer 121, the second adjustment layer 122, and the third adjustment layer 123 are formed on the first upper Bragg reflector 106. Additionally, a part of layers in the wavelength adjustment area 120 is removed to correspond to a wavelength emitted from each surface-emitting laser, as described above.

Each surface-emitting laser in a surface-emitting laser element in the present embodiment has a mesa structure, wherein such a mesa structure is formed by removing a semiconductor layer between surface-emitting lasers to be formed, due to etching. After a mesa structure is formed, heat treatment in water vapor is conducted to oxidize the electric current narrowing layer 108 from a periphery of the mesa structure whereby the selective oxidation area 108a (an oxidized area) on a peripheral portion and the unoxidized electric current narrowing area 108b on a central portion are formed. That is, the electric current narrowing layer 108 is composed of the oxidized selective oxidation area 108a and the unoxidized electric current narrowing area 108b to provide an electric current narrowing structure. Additionally, a shape viewed from a top of the mesa structure may be formed to be a circular shape or may be formed to be a shape such as an elliptical shape, a square shape, or a rectangular shape.

Furthermore, the second upper Bragg reflector 107 is formed on the wavelength adjustment layer 130 in which removal corresponding to each surface-emitting laser is conducted by etching. The second upper Bragg reflector 107 is formed by laminating 8.5 pairs of a $TiO_2$ high refractive index layer and a $SiO_2$ low refractive index layer in such a manner that an optical film thickness of each layer is $\lambda/4$. Additionally, it may be only necessary for the second upper Bragg reflector 107 to be made of a dielectric material(s) and formed by laminating a high refractive index material and a low refractive index material, wherein it may be possible to provide a material such as an oxide, a nitride, or a fluoride, specifically. For a high refractive index material, it may be possible to provide $Ta_2O_5$, $HfO_2$, etc., as well as $TiO_2$. Furthermore, for a low refractive index material, it may be possible to provide $MgF_2$, etc., as well as $SiO_2$. For a method for forming a $TiO_2$ high refractive index layer and a $SiO_2$ low refractive index layer in the second upper Bragg reflector 107, formation is conducted by sputtering or vacuum deposition, etc. Moreover, a protective film 140 made of SiN is formed overall, and a resin film 141 made of a resin material such as a polyimide is formed between mesas of respective surface-emitting lasers.

Afterward, an upper electrode 111 is formed which is a p-side electrode. Such an upper electrode 111 is each formed to correspond to each surface-emitting laser, wherein each upper electrode 111 is connected to each of electrode pads 21-24. Furthermore, a lower electrode 112 which is an n-side electrode is formed on a back face of the substrate 101.

Next, a method for forming the wavelength adjustment layer 130 in the surface-emitting laser element in the present embodiment will be described in detail.

First, the lower Bragg reflector 102, lower spacer layer 103, active layer 104, upper spacer layer 105, first upper Bragg reflector 106, contact layer 110, and wavelength adjustment area 120 which made of semiconductor materials are formed on the substrate 101 by epitaxial growth in MOCVD or MBE. Additionally, the wavelength adjustment layer 130 is composed of the contact layer 110 and the wavelength adjustment area 120 wherein the wavelength adjustment area 120 is formed by laminating the first adjustment layer 121, the second adjustment layer 122, and the third adjustment layer 123. Herein, as mentioned above, the first adjustment layer 121 and the third adjustment layer 123 are made of GaInP while the second adjustment layer 122 is made of GaAsP.

Then, a resist pattern is formed on an area on which the first surface-emitting laser 11 is formed. Specifically, a resist pattern is formed by applying a photo-resist onto the third adjustment layer 123 on the wavelength adjustment area 120 and conducting light exposure and development thereof by a light exposure device.

Then, the third adjustment layer 123 on an area on which no resist pattern has been formed is removed by wet etching. Specifically, wet etching is conducted by a mixed fluid of hydrochloric acid and water, because the third adjustment layer 123 is made of GaInP. Thereby, only the third adjustment layer 123 on an area on which no resist pattern has been formed is removed to expose a surface of the second adjustment layer 122. Additionally, it may be possible for such a mixed fluid to conduct etching of GaInP making the third adjustment layer 123 but it may hardly be possible to conduct etching of GaAsP making the second adjustment layer 122. Such a mixed fluid may also be described as a first etching fluid. Afterward, the resist pattern is removed by an organic solvent, etc.

Then, a resist pattern is formed on an area on which the first surface-emitting laser 11 and the second surface-emitting laser 12 are formed. Specifically, a resist pattern is formed by applying a photo-resist onto the third adjustment layer 123 and second adjustment layer 122 on the wavelength adjustment area 120 and conducting light exposure and development thereof by a light exposure device.

Then, the second adjustment layer 122 on an area on which no resist pattern has been formed is removed by wet etching. Specifically, wet etching is conducted by a mixed fluid of sulfuric acid, hydrogen peroxide, and water, because the second adjustment layer 122 is made of GaAsP. Thereby, only the second adjustment layer 122 on an area on which no resist pattern has been formed is removed to expose a surface of the first adjustment layer 121. Additionally, it may be possible for such a mixed fluid to conduct etching of GaAsP making the second adjustment layer 122 but it may hardly be possible to conduct etching of GaInP making the first adjustment layer 121. Such a mixed fluid may be described as a second etching fluid. Afterward, the resist pattern is removed by an organic solvent, etc.

Then, a resist pattern is formed on an area on which the first surface-emitting laser 11, the second surface-emitting laser 12, and the third surface-emitting laser 13 are formed. Specifically, a resist pattern is formed by applying a photo-resist onto the first adjustment layer 121, second adjustment layer 122, and third adjustment layer 123 on the wavelength adjustment area 120 and conducting light exposure and development thereof by a light exposure device.

Then, the first adjustment layer 121 on an area on which no resist pattern has been formed is removed by wet etching. Specifically, the first adjustment layer 121 on an area on which no resist pattern has been formed is removed by the first etching fluid. Thereby, only the first adjustment layer 121 on an area on which no resist pattern has been formed is removed to expose a surface of the contact layer 110. Afterward, the resist pattern is removed by an organic solvent, etc.

Then, the second upper Bragg reflector 107 is formed. Specifically, formation is conducted by alternately laminating a dielectric film made of a high refractive index material and a dielectric film made of a low refractive index material, which are composed of an oxide, a nitride, a fluoride, etc., with each having a predetermined film thickness, due to sputtering, etc. Additionally, it may also be possible form the second upper Bragg reflector 107 by laminating and forming semiconductor materials with different refractive indices.

Thereby, it may be possible to form the wavelength adjustment layer 130 and second upper Bragg reflector 107 in the surface-emitting laser element in the present embodiment.

In the present embodiment, Al is not included in any of the first adjustment layer 121, second adjustment layer 122, and third adjustment layer 123 composing the wavelength adjustment area 120 in the wavelength adjustment layer 130, and hence, oxidation, etc., is hardly caused after etching, whereby it may be possible to maintain a clean surface condition after etching. That is, it may be extremely easy for Al to be corroded, and hence, when one of the first adjustment layer 121, second adjustment layer 122, and third adjustment layer 123 is formed by a material including Al, a surface condition after conducting wet etching, etc., may be poor, wherein even though the second upper Bragg reflector 107 is formed thereon, peeling thereof may be caused or a thickness thereof may be inhomogeneous. However, the wavelength adjustment area 120 in the surface-emitting laser element in the present embodiment is formed by a material including no Al, and hence, corrosion of Al, etc., may not be caused and such a problem may not occur.

Furthermore, the wavelength adjustment area 120 in the wavelength adjustment layer 130 in the present embodiment is made of alternate GaAsP and GaInP, and when wet etching is conducted, etching is conducted by using two kinds of etching fluids wherein, mutually, it may be possible to conduct etching of one thereof and it may not be possible to conducting etching of the other. Etching is conducted by using two such kinds of etching fluids, whereby a surface after etching may be flat and it may be possible to conduct formation with a predetermined thickness without being over-etched. Thereby, it may be possible to obtain a surface-emitting laser element with a stable characteristic.

Additionally, although a case of a combination of GaAsP and GaInP has been described in the description(s) for the present embodiment, there may be provided a combination with another material including no Al which is further provided for a different etching fluid and is a semiconductor material with a band gap energy greater than an oscillation wavelength. For 894.6 nm which is an oscillation wavelength in the present embodiment, there is provided, for example, GaInAsP/GaInP, GaAs/GaInP, GaAs/GaInAsP, GaAsP/GaInAsP, etc., as a combination of such semiconductor materials. Furthermore, N or Sb may be added thereto like GaAsN/GaInP, GaInNAs/GaInP, GaAsSb/GaInP, etc.

As described above, it may be possible to form plural surface-emitting lasers for emitting light with different wavelengths on one substrate 101 in the surface-emitting laser element in the present embodiment. Thereby, even if a variation in a film thickness of a semiconductor layer, etc., is caused in manufacturing a surface-emitting laser element, one emitting light with a wavelength closest to a desired wavelength is selected among the first surface-emitting laser 11 to the fourth surface-emitting laser 14 whereby it may be possible to obtain a semiconductor laser with a desired wavelength easily. Thereby, it may be possible to manufacture a surface-emitting laser element having a surface-emitting laser emitting light with a predetermined wavelength at a low cost.

Additionally, when the contact layer 110 is formed on the wavelength adjustment area 120, an amount of electric current capable of flowing in each surface-emitting laser, etc., is changed depending on a thickness of the wavelength adjustment area 120 and an electrical characteristic and light emission characteristic of each surface-emitting laser may also be greatly different. Furthermore, when electric current flows in the wavelength adjustment area 120, an electrical resistance may be increased by a band discontinuity on an interface of each layer. However, the contact layer 110 is formed under the wavelength adjustment area 120 in the surface-emitting laser element in the present embodiment, whereby electric current injected into the surface emitting laser may not pass thought the wavelength adjustment area 120 and a resistance, etc., may be not changed depending on a thickness of the wavelength adjustment area 120.

Next, an advantage of the first upper Bragg reflector 106 formed between the wavelength adjustment layer 130 and a resonator area will be described. For example, when a wavelength adjustment layer is formed in a resonator area having an optical length of one wavelength and when four wavelengths are provided with a central wavelength of 895 nm and a wavelength interval of 1 nm, one layer composing the wavelength adjustment layer is provided with 1.3 nm, wherein it may be extremely difficult to conduct uniform formation on a wafer surface with a current crystal growth technique. Hence, the first upper Bragg reflector 106 which is a part of the upper Bragg reflector is formed between the resonator area and the wavelength adjustment layer 130 in the present embodiment. Specifically, the first upper Bragg reflector 106 is formed by laminating 6 pairs of an n-$Al_{0.1}Ga_{0.9}As$ high refractive index layer and an n-$Al_{0.9}Ga_{0.1}As$ low refractive index layer in such a manner that an optical film thickness of each layer is $\lambda/4$. Furthermore, the contact layer 110 is formed on the first upper Bragg reflector 106 and the wavelength adjustment area 120 is formed on the contact layer 110. The first adjustment layer 121, second adjustment layer 122, and third adjustment layer 123 composing the wavelength adjustment area 120 are formed in such a manner that film thicknesses of GaInP/GaAsP/GaInP are 16 nm/16 nm/16 nm, respectively, wherein it may be possible to conduct sufficiently uniform manufacturing on a current crystal growth technique. Hence, it may be possible to reduce a deviation of a wavelength interval among surface-emitting lasers.

Furthermore, it may also be possible to reduce an electrical resistance simultaneously by forming such a structure. That is, the second upper Bragg reflector 107 being a dielectric is formed on a top of the wavelength adjustment layer 130 and the upper electrode 111 is formed at a surrounding thereof, wherein when a wavelength adjustment layer is provided in a resonator area, it may be necessary to provide an AlAs layer to be selectively oxidized at a position close to a contact layer in view of a layer structure and an electric current channel may be narrow to increase an electrical resistance. Herein, the first upper Bragg reflector 106 is formed between the wavelength adjustment layer 130 (in which the contact layer 110 is formed under the wavelength adjustment area 120(and the resonator area in the present embodiment, whereby it may be possible to extend an electric current channel and it may be possible to reduce an electrical resistance.

Additionally, it may be possible to further increase a film thickness of each layer in the wavelength adjustment area 120 in the wavelength adjustment layer 130 by the second upper Bragg reflector 107 being seven or more pairs, whereby uniform manufacturing may be facilitated and an electrical resistance may also be reduced. However, if the number of a pair(s) in the second upper Bragg reflector 107 is increased, an optical thickness of the wavelength adjustment layer 130 may be greater than $\lambda/4$ and an overall reflectance of the upper reflector may be degraded. Thus, an optimal number of a pair(s) may be present for the second upper Bragg reflector 107, so that it may be possible for an optical thickness of the wavelength adjustment layer 130 to be close to $\lambda/4$.

Next, a thickness of the wavelength adjustment layer 130 will be described. When an optical thickness P of the wavelength adjustment layer 130 is $\lambda/4 \leq P < \lambda/2$ as illustrated in FIG. 4A, it may be possible for reflectances of the upper Bragg reflectors in the first surface-emitting laser 11, second surface-emitting laser 12, third surface-emitting laser 13, and fourth surface-emitting laser 14 to be generally constant as illustrated in FIG. 4B. Additionally, L1 is a surface of the wavelength adjustment layer 130 in the first surface-emitting laser 11 and L2 is a surface of the wavelength adjustment layer 130 in the second surface-emitting laser 12 while L3 is a surface of the wavelength adjustment layer 130 in the third surface-emitting laser 13 and L4 indicates a surface of the wavelength adjustment layer 130 in the fourth surface-emitting laser 14.

Figure 5B:
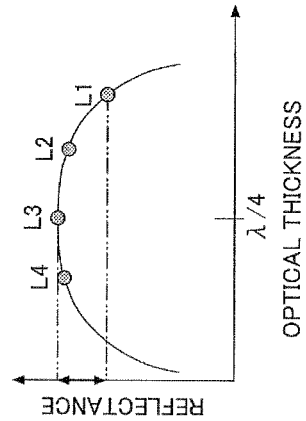
FIG. 5A and FIG. 5B are illustration diagrams (2) of a wavelength adjustment layer of a surface-emitting laser element in a first embodiment.
Figure 5A:
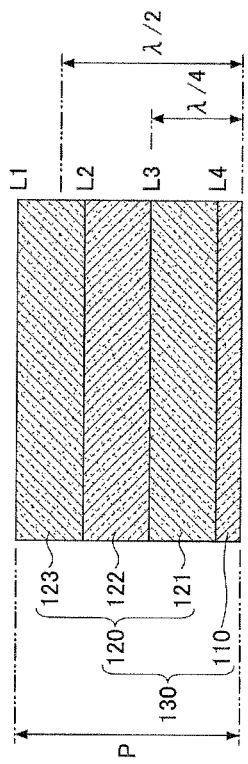

On the other hand, when an optical thickness P of the wavelength adjustment layer 130 is $\lambda/2 < P$ as illustrated in FIG. 5A, reflectances of the upper Bragg reflectors in the first surface-emitting laser 11, second surface-emitting laser 12, third surface-emitting laser 13, and fourth surface-emitting laser 14 may be greatly different therefrom as illustrated in FIG. 5B.

Figure 6A:
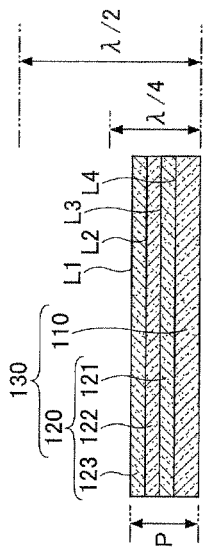
FIG. 6A and FIG. 6B are illustration diagrams (3) of a wavelength adjustment layer of a surface-emitting laser element in a first embodiment.
Figure 6B:
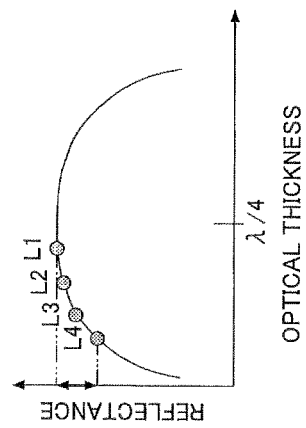

Furthermore, when an optical thickness P of the wavelength adjustment layer 130 is $P < \lambda/4$ as illustrated in FIG. 6A, reflectances of the upper Bragg reflectors in the first surface-emitting laser 11, second surface-emitting laser 12, third surface-emitting laser 13, and fourth surface-emitting laser 14 may be greatly different therefrom as illustrated in FIG. 6B.

As described above, it is preferable for an optical thickness P of the wavelength adjustment layer 130 to be $\lambda/4 \leq P < \lambda/2$, and if such a matter is generalized, it is preferable to be $(2N-1)\lambda/4 \leq P < N\lambda/2$. Additionally, N is a positive integer, and if application of an influence of light absorption to cause an adverse effect such as an increase of a threshold electric current is taken into consideration, it is preferable for N to be small.

Figure 7A:
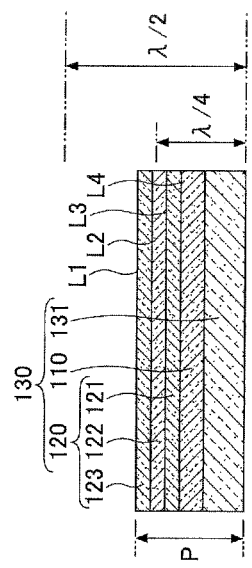
FIG. 7A and FIG. 7B are illustration diagrams (4) of a wavelength adjustment layer of a surface-emitting laser element in a first embodiment.
Figure 7B:
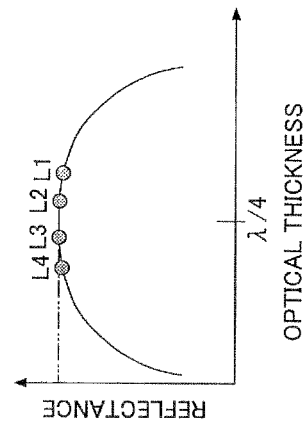
Figure 8:
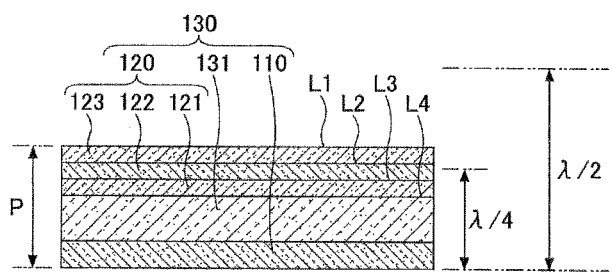
FIG. 8 is an illustration diagram (5) of a wavelength adjustment layer of a surface-emitting laser element in a first embodiment.
Figure 9:
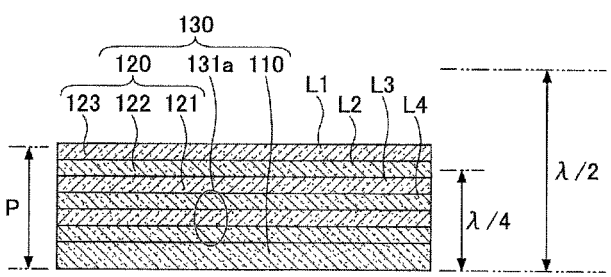
FIG. 9 is an illustration diagram (6) of a wavelength adjustment layer of a surface-emitting laser element in a first embodiment.

Furthermore, when a thickness of the wavelength adjustment area 120 is small and a sum of optical thicknesses of the wavelength adjustment area 120 and contact layer 110 is less than $\lambda/4$, a phase adjustment area 131 may be provided to the wavelength adjustment layer 130 as illustrated in FIG. 7A, Thereby, it may be possible for an optical thickness P of the wavelength adjustment layer 130 to be $\lambda/4 \leq P < \lambda/2$, and in general, $(2N-1)\lambda/4 \leq P < 2N\lambda/4$, and as illustrated in FIG. 7B, it may be possible for reflectances of the upper Bragg reflectors in the first surface-emitting laser 11, second surface-emitting laser 12, third surface-emitting laser 13, and fourth surface-emitting laser 14 to be generally constant. Additionally, in such a case, the wavelength adjustment layer 130 is composed of the contact layer 110, the wavelength adjustment area 120, and the phase adjustment area 131. Furthermore, the phase adjustment area 131 is made of AlGaAs, wherein the phase adjustment area 131 may be formed under the contact layer 110 as illustrated in FIG. 7A or the phase adjustment area 131 may be formed between the contact layer 110 and the wavelength adjustment area 120 as illustrated in FIG. 8. Moreover, a phase adjustment area 131a may be composed of a laminated film in which GaAsP and GaInP are alternately laminated as illustrated in FIG. 9.

Furthermore, the surface-emitting laser element in the present embodiment has a structure in which plural films are formed in the wavelength adjustment area 120, wherein it is preferable to form the wavelength adjustment layer 130 in such a manner that, when a layer number of a formed film(s) (an adjustment layer(s)) is M (wherein M is a positive integer), a position at which an optical film thickness thereof is $\lambda/4$ an (M+1)/2 th film (adjustment layer) from a top thereof in a case where M is an odd number or an M/2 th or (M/2)+1 th film (adjustment layer) from a top thereof in a case where M is an even number.

[Second Embodiment]

Figure 10:
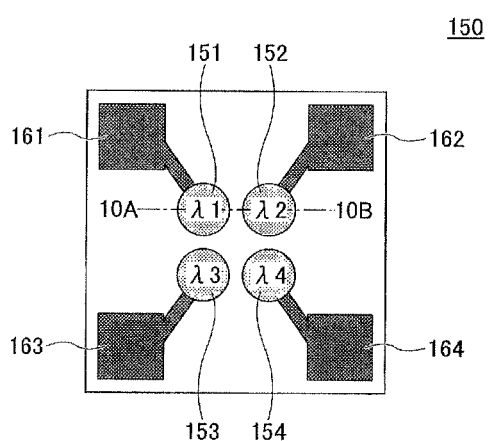
FIG. 10 is a top view of a surface-emitting laser element in a second embodiment.
Figure 11:
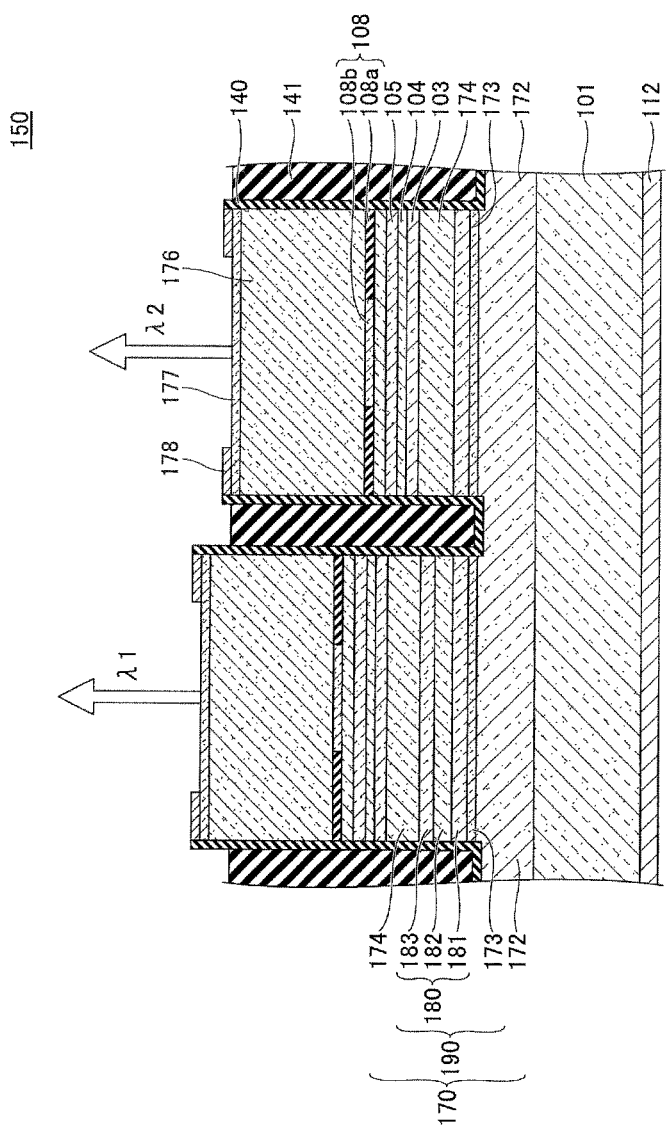
FIG. 11 is an illustration diagram of a surface-emitting laser element in a second embodiment.

Next, a surface-emitting laser element in a second embodiment will be described. Additionally, the surface-emitting laser element in the present embodiment is a surface-emitting laser for a wavelength of 894.6 nm and a structure in which a wavelength adjustment area is provided on a lower Bragg reflector. As illustrated in FIG. 10 and FIG. 11, a surface-emitting laser element 150 in the present embodiment has plural surface-emitting lasers, and specifically, has a first surface-emitting laser 151, a second surface-emitting laser 152, a third surface-emitting laser 153, and a fourth surface-emitting laser 154. Additionally, FIG. 10 has been simplified for the sake of an explanation of the present embodiment, wherein depiction of a contact layer, etc., has been omitted conveniently. Furthermore, FIG. 11 is a cross-section diagram provided by cutting along a dashed dotted line 10A-10B in FIG. 10.

The surface-emitting laser element 150 in the present embodiment is formed on a 300 µm square semiconductor chip, wherein each of the first surface-emitting laser 151, second surface-emitting laser 152, third surface-emitting laser 153, and fourth surface-emitting laser 154 formed on such a semiconductor chip is connected to an electrode pad provided to correspond thereto. Specifically, an electrode pad 161 is connected to the first surface-emitting laser 151 and an electrode pad 162 is connected to the second surface-emitting laser 152 while an electrode pad 163 is connected to the third surface-emitting laser 153 and an electrode pad 164 is connected to the fourth surface-emitting laser 154.

Furthermore, the first surface-emitting laser 151, the second surface-emitting laser 152, the third surface-emitting laser 153, and the fourth surface-emitting laser 154 provide emitted light with mutually different wavelengths. Namely, a wavelength $\lambda1$ emitted from the first surface-emitting laser 151, a wavelength $\lambda2$ emitted from the second surface-emitting laser 152, a wavelength $\lambda3$ emitted from the third surface-emitting laser 153, and a wavelength $\lambda4$ emitted from the fourth surface-emitting laser 154 are mutually different wavelengths.

Additionally, the surface-emitting laser element in the present embodiment is to obtain a surface-emitting laser with an oscillation wavelength of 894.6 nm, wherein four surface-emitting lasers are formed on a 300 µm square semiconductor chip (substrate). Because it may be possible to form plural surface-emitting lasers in a narrow area in a surface-emitting laser element, there is little change in a position of light emission point even when a surface-emitting laser to conduct light emission is switched.

For the surface-emitting laser element in the present embodiment, semiconductor materials with different refractive indices are alternately laminated onto and formed on a substrate 101 made of a semiconductor, etc., to form a first lower Bragg reflector 172, and a phase adjustment layer 173, a wavelength adjustment area 180, a second lower Bragg reflector 174, a lower spacer layer 103, an active layer 104, and an upper spacer layer 105 are formed on the first lower Bragg reflector 172. An upper Bragg reflector 176 and a contact layer 177 are formed on the upper spacer layer 105. Furthermore, an upper electrode 178 is formed on and connected to the contact layer 177 and a lower electrode 112 is formed on a back face of the substrate 101. Additionally, a wavelength adjustment layer 190 is composed of the wavelength adjustment area 180 and the phase adjustment layer 173 in the present embodiment, while a lower Bragg reflector 170 is composed of the first lower Bragg reflector 172, the phase adjustment area 173, the wavelength adjustment area 180, and the second lower Bragg reflector 174.

Furthermore, the first lower Bragg reflector 172, phase adjustment area 173, wavelength adjustment area 180, second lower Bragg reflector 174, lower spacer layer 103, active layer 104, upper spacer layer 105, upper Bragg reflector 176, and contact layer 177, which are semiconductor layers formed on the substrate 101, are formed by epitaxially growing semiconductor materials. Specifically, such semiconductor layers are formed by epitaxial growth in MOCVD or MBE.

In the surface-emitting laser element in the present embodiment, thicknesses of the respective wavelength adjustment areas 180 in the first surface-emitting laser 151, second surface-emitting laser 152, third surface-emitting laser 153, and fourth surface-emitting laser 154 are different therefrom. Specifically, the wavelength adjustment area 180 is composed of a first adjustment layer 181, a second adjustment layer 182, and a third adjustment layer 183. In the present embodiment, the first adjustment layer 181 and the third adjustment layer 183 are made of GaInP while the second adjustment layer 182 is made of GaAsP. Additionally, materials for making the first adjustment layer 181, second adjustment layer 182, and third adjustment layer 183 may be opposite thereof.

Thus, thicknesses of the wavelength adjustment areas 180, that is, thicknesses of the wavelength adjustment layers 190, in the first surface-emitting laser 151, second surface-emitting laser 152, third surface-emitting laser 153, and fourth surface emitting laser 154 are different in the surface-emitting laser element in the present embodiment.

Specifically, the first adjustment layer 181, the second adjustment layer 182, and the third adjustment layer 183 are formed on the wavelength adjustment area 180 in the first surface-emitting laser 151, wherein light with a wavelength of λ1 is emitted which corresponds to a thickness of the wavelength adjustment layer 190 which includes such a wavelength adjustment area 180.

Furthermore, the first adjustment layer 181 and the second adjustment layer 182 are formed in the wavelength adjustment area 180 in the second surface-emitting laser 152, wherein light with a wavelength of λ2 is emitted which corresponds to a thickness of the wavelength adjustment layer 190 which includes such a wavelength adjustment area 180.

Furthermore, the first adjustment layer 181 is formed in the wavelength adjustment area 180 in the third surface-emitting laser 153, wherein light with a wavelength of λ3 is emitted which corresponds to a thickness of the wavelength adjustment layer 190 which includes such a wavelength adjustment area 180.

Furthermore, the wavelength adjustment area 180 is not formed in the fourth surface-emitting laser 154, and hence, light with a wavelength of λ4 is emitted which corresponds to a thickness of the wavelength adjustment layer 190 in a case where the wavelength adjustment area 180 is not formed.

Thus, it may be possible to change thicknesses of the wavelength adjustment areas 180 in the first surface-emitting laser 151, second surface-emitting laser 152, third surface-emitting laser 153, and fourth surface-emitting laser 154 little by little, and it may be possible to emit light with each wavelength corresponding to a thickness of at least one or each of the wavelength adjustment areas 180.

In the present embodiment, an n-GaAs substrate is used for the substrate 101. Furthermore, the lower Bragg reflector 170 is formed by laminating 35.5 pairs of an n-$Al_{0.1}Ga_{0.9}As$ high refractive index layer and n-$Al_{0.9}Ga_{0.1}As$ low refractive index layer in such a manner that an optical film thickness of each layer is $\lambda/4$.

As described above, the lower Bragg reflector 170 is composed of the first lower Bragg refection mirror 172, phase adjustment area 173, wavelength adjustment area 180, and second lower Bragg reflector 179 on the substrate 101. Hence, the phase adjustment area 173 and wavelength adjustment area 180 are formed inside the lower Bragg reflector 170. Additionally, in the present embodiment, formation is conducted in such a manner that a sum of an optical film thickness of the phase adjustment area 173 and a half of an optical film thickness of the wavelength adjustment area 180, that is, an optical film thickness from a bottom of the phase adjustment area 173 to a central portion of the wavelength adjustment area 180 is $\lambda/4$, as illustrated in FIG. 12.

The active layer 104 composed of a GaInAs quantum well layer/a GaInPAs barrier layer is formed on the lower Bragg reflector 170 through the lower spacer layer 103 made of $Al_{0.2}Ga_{0.8}As$. The upper spacer layer 105 made of $Al_{0.2}Ga_{0.8}As$ is formed on the active layer 104. Additionally, a resonator area provided with an optical thickness of one wavelength is composed of the lower spacer layer 103, the active layer 104, and the upper spacer layer 105.

The upper Bragg reflector 176 is formed by laminating 24 pairs of an n-$Al_{0.1}Ga_{0.9}As$ high refractive index layer and an n-$Al_{0.9}Ga_{0.1}As$ low refractive index layer in such a manner that an optical film thickness of each layer is $\lambda/4$. One of low refractive index layers of the upper Bragg reflector 176 is composed of an electric current narrowing layer 108 made of AlAs, wherein a peripheral portion of the electric current narrowing layer 108 is selectively oxidized to form a selective oxidation area 108a and an unoxidized electric current narrowing area 108b is formed on a central portion thereof. Furthermore, the contact layer 177 made of p-GaAs is formed on the upper Bragg reflector 176.

Figure 12B:
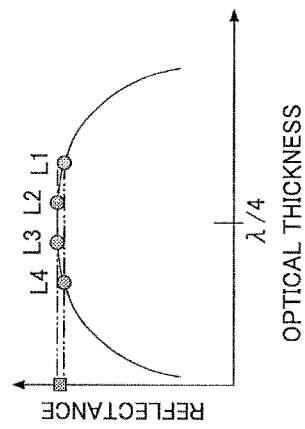
FIG. 12A and FIG. 12B are illustration diagrams (1) of a wavelength adjustment layer of a surface-emitting laser element in a second embodiment.
Figure 12A:
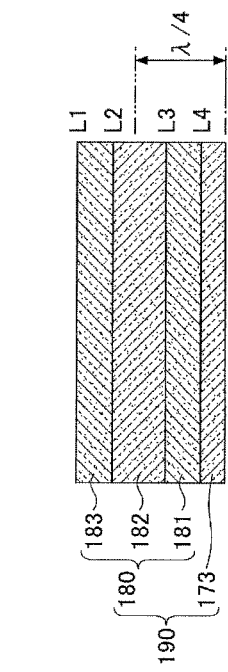

When a sum of a value of an optical film thickness of the phase adjustment area 173 and a value of a half of an optical film thickness of the wavelength adjustment area 180 is about $\lambda/4$ as illustrated in FIG. 12A, it may be possible for reflectances of the lower Bragg reflectors in the first surface-emitting laser 151, second surface-emitting laser 152, third surface-emitting laser 153, and fourth surface-emitting laser 154 to be generally constant as illustrated in FIG. 12B.

Additionally, L1 is a surface of the wavelength adjustment layer 190 in the first surface-emitting laser 151 and L2 is a surface of the wavelength adjustment layer 190 in the second surface-emitting laser 152 while L3 is a surface of the wavelength adjustment layer 190 in the third surface-emitting laser 153 and L4 indicates a surface of the wavelength adjustment layer 190 in the fourth surface-emitting laser 154.

Each surface-emitting laser in a surface-emitting laser element in the present embodiment has a mesa structure, wherein such a mesa structure is formed by removing a semiconductor layer between surface-emitting lasers to be formed, due to dry etching, etc. After a mesa structure is formed, heat treatment in water vapor is conducted to oxidize the electric current narrowing layer 108 from a periphery of the mesa structure whereby the selective oxidation area 108a (an oxidized area) on a peripheral portion and the unoxidized electric current narrowing area 108b on a central portion are formed. That is, the electric current narrowing layer 108 is composed of the oxidized selective oxidation area 108a and the unoxidized electric current narrowing area 108b to provide an electric current narrowing structure. Specifically, AlAs making the electric current narrowing layer 108 is subjected to heat treatment in water vapor to be oxidized and form $Al_xO_y$, wherein thus formed $Al_xO_y$ makes the selective oxidation area 108a. Herein, the electric current narrowing area 108b is made of unoxidized AlAs in the electric current narrowing layer 108. Additionally, a shape viewed from a top of the mesa structure may be formed to be a circular shape or may be formed to be a shape such as an elliptical shape, a square shape, or a rectangular shape.

Moreover, a protective film 140 made of SiN is formed overall, and a resin film 141 is formed between mesas of respective surface-emitting lasers by embedding a resin material such as a polyimide. Afterward, an upper electrode 178 is formed which is a p-side electrode. Such an upper electrode 178 is each formed to correspond to each surface-emitting laser, wherein each upper electrode 178 is connected to each of electrode pads 161-164.

Specifically, the protective film 140 made of SiN is formed and the resin layer 141 is formed by embedding and planarizing a resin material such as a polyimide between mesas of respective surface-emitting lasers. Afterward, the protective film 140 and resin layer 141 on the contact layer 177 are removed to expose the contact layer 177 and the upper electrode 178 is formed on the contact layer 177. Additionally, a lower electrode 112 which is an n-side electrode is formed on a back face of the substrate 101.

The surface-emitting laser element in the present embodiment emits laser light at an opposite side of a side of the substrate 101. Additionally, it may be possible for the protective film 140 made of SiN to protect a side face and bottom face of a layer including Al which appears due to mesa etching and is readily corroded, due to a dielectric thereof in the present embodiment, and hence, it may be possible to improve reliability.

Next, an advantage of the second lower Bragg reflector 174 formed between the wavelength adjustment area 180 and a resonator will be described. When a wavelength adjustment area is formed in a resonator having an optical length of one wavelength and when four wavelengths are provided with a central wavelength of 895 nm and a wavelength interval of 1 nm, one layer of the adjustment layers composing the wavelength adjustment layer is provided with about 1 nm, wherein it may be extremely difficult to conduct uniform formation on a wafer surface with a current crystal growth technique.

Hence, the second lower Bragg reflector 174 which is a part of the lower Bragg reflector 170 is formed between the resonator and the wavelength adjustment area 180 in the present embodiment. Specifically, the second lower Bragg reflector 174 is formed by laminating 10 pairs of an n-$Al_{0.1}Ga_{0.9}As$ high refractive index layer and an n-$Al_{0.9}Ga_{0.1}As$ low refractive index layer in such a manner that an optical film thickness of each layer is $\lambda/4$. Thereby, it may be possible for film thicknesses of GaInP/GaAsP/GaInP in the first adjustment layer 181, second adjustment layer 182, and third adjustment layer 183 composing the wavelength adjustment area 180 to be 16 nm/16 nm/16 nm, respectively, and it may be possible to conduct sufficiently uniform manufacturing on a current crystal growth technique, whereby it may be possible to reduce a deviation of a wavelength interval similarly to the first embodiment.

Figure 13B:
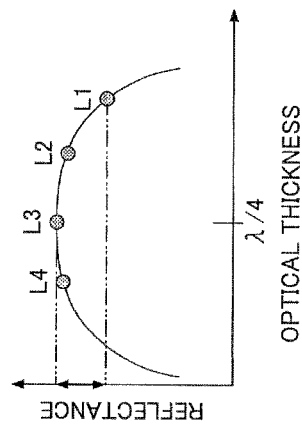
FIG. 13A and FIG. 13B are illustration diagrams (2) of a wavelength adjustment layer of a surface-emitting laser element in a second embodiment.
Figure 13A:
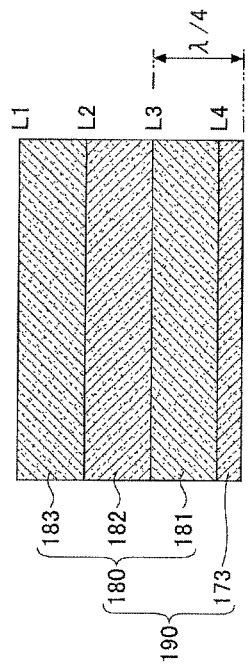

Additionally, when the second lower Bragg reflector 174 is composed of eleven or more pairs, it may be possible for a film thickness of each layer in the wavelength adjustment area 180 to be even larger, and hence, it may be possible to further improve uniformity. However, if the number of a pair(s) in the second lower Bragg reflector 174 is increased as illustrated in FIG. 13A and FIG. 13B, an optical film thickness of the wavelength adjustment area 180 may be much greater than $\lambda/4$ (an optical film thickness of a Bragg reflector), and hence, an overall reflectance of the lower Bragg reflector 170 may be degraded, which is not preferable. Thus, an optimal number of a pair(s) may be present for the second lower Bragg reflector so that an optical thickness of the wavelength adjustment area 180 should be close to $\lambda/4$.

On the other hand, when a sum of a value of an optical film thickness of the phase adjustment area 173 and a value of a half of an optical film thickness of the wavelength adjustment area 180 is $\lambda/4$ or greater as illustrated in FIG. 13A, a reflectance of the lower Bragg reflector in each of the first surface-emitting laser 151, second surface-emitting laser 152, third surface-emitting laser 153, and fourth surface-emitting laser 154 may be large as illustrated in FIG. 13B. However, in the present embodiment, it may be possible to improve a uniformity of a reflectance of each lower Bragg reflector as illustrated in FIG. 12G.

Next, a method for forming the wavelength adjustment area 180 in the surface-emitting laser element in the present embodiment will be described in detail.

First, the first lower Bragg reflector 172, phase adjustment area 173, and wavelength adjustment area 180 which made of semiconductor materials are formed on the substrate 101 by epitaxial growth in MOCVD or MBE. As described above, the wavelength adjustment layer 190 is composed of the phase adjustment area 173 and the wavelength adjustment area 180, wherein the wavelength adjustment area 180 is formed by laminating the first adjustment layer 181, the second adjustment layer 182, and the third adjustment layer 183. Additionally, the first adjustment layer 181 and the third adjustment layer 183 are made of GaInP while the second adjustment layer 182 is made of GaAsP.

Then, a resist pattern is formed on an area on which the first surface-emitting laser 151 is formed. Specifically, a resist pattern is formed by applying a photo-resist onto the third adjustment layer 183 on the wavelength adjustment area 180 and conducting light exposure and development thereof by a light exposure device.

Then, the third adjustment layer 183 on an area on which no resist pattern has been formed is removed by wet etching. Specifically, wet etching is conducted by a mixed fluid of hydrochloric acid and water, because the third adjustment layer 133 is made of GaInP. Thereby, only the third adjustment layer 183 on an area on which no resist pattern has been formed is removed to expose a surface of the second adjustment layer 182. Additionally, it may be possible for such a mixed fluid to conduct etching of GaInP making the third adjustment layer 183 but it may hardly be possible to conduct etching of GaAsP making the second adjustment layer 182. Such a mixed fluid may also be described as a first etching fluid. Afterward, the resist pattern is removed by an organic solvent, etc.

Then, a resist pattern is formed on an area on which the first surface-emitting laser 151 and the second surface-emitting laser 152 are formed. Specifically, a resist pattern is formed by applying a photo-resist onto the third adjustment layer 183 and second adjustment layer 182 on the wavelength adjustment area 180 and conducting light exposure and development thereof by a light exposure device.

Then, the second adjustment layer 182 on an area on which no resist pattern has been formed is removed by wet etching. Specifically, wet etching is conducted by a mixed fluid of sulfuric acid, hydrogen peroxide, and water, because the second adjustment layer 182 is made of GaAsP. Thereby, only the second adjustment layer 182 on an area on which no resist pattern has been formed is removed to expose a surface of the first adjustment layer 181. Additionally, it may be possible for such a mixed fluid to conduct etching of GaAsP making the second adjustment layer 182 but it may hardly be possible to conduct etching of GaInP making the first adjustment layer 181. Such a mixed fluid may be described as a second etching fluid. Afterward, the resist pattern is removed by an organic solvent, etc.

Then, a resist pattern is formed on an area on which the first surface-emitting laser 151, the second surface-emitting laser 152, and the third surface-emitting laser 153 are formed. Specifically, a resist pattern is formed by applying a photo-resist onto the first adjustment layer 181, second adjustment layer 182, and third adjustment layer 183 on the wavelength adjustment area 180 and conducting light exposure and development thereof by a light exposure device.

Then, the first adjustment layer 181 on an area on which no resist pattern has been formed is removed by wet etching. Specifically, the first adjustment layer 181 on an area on which no resist pattern has been formed is removed by the first etching fluid. Thereby, only the first adjustment layer 181 on an area on which no resist pattern has been formed is removed to expose a surface of the phase adjustment layer 173. Afterward, the resist pattern is removed by an organic solvent, etc.

Then, the second lower Bragg reflector 174 is formed. Thereby, it may be possible to form the lower Bragg reflector 170 including the wavelength adjustment area 180 in the surface-emitting laser element in the present embodiment.

In the present embodiment, Al is not included in any of the first adjustment layer 181, second adjustment layer 182, and third adjustment layer 183 composing the wavelength adjustment area 180 in the wavelength adjustment layer 190, and hence, oxidation, etc., is hardly caused after etching, whereby it may be possible to maintain a clean surface condition after etching. That is, it may be extremely easy for Al to be corroded, and hence, when one of the first adjustment layer 181, second adjustment layer 182, and third adjustment layer 183 is formed by a material including Al, a surface condition after conducting wet etching, etc., may be poor, wherein even though the second lower Bragg reflector 174 is formed thereon, peeling thereof may be caused or a thickness thereof may be inhomogeneous. However, the wavelength adjustment area 180 in the surface-emitting laser element in the present embodiment is formed by a material including no Al, and hence, corrosion of Al, etc., may not be caused and such a problem may not occur.

Furthermore, the wavelength adjustment area 180 in the wavelength adjustment layer 190 in the present embodiment is made of alternate GaAsP and GaInP, and when wet etching is conducted, etching is conducted by using two kinds of etching fluids wherein, mutually, it may be possible to conduct etching of one thereof and it may not be possible to conducting etching of the other. As etching is conducted by using two such kinds of etching fluids, a surface after etching may be flat and it may be possible to conduct formation with a predetermined thickness without being over-etched. Thereby, it may be possible to obtain a surface-emitting laser element with a stable characteristic.

Additionally, although a case of a combination of GaAsP and GaInP has been described in the description(s) for the present embodiment, there may be provided a combination with another material including no Al which is further provided for a different etching fluid and is a semiconductor material with a band gap energy greater than an oscillation wavelength. For 894.6 nm which is an oscillation wavelength in the present embodiment, there is provided, for example, GaInAsP/GaInP, GaAs/GaInP, GaAs/GaInAsP, GaAsP/GaInAsP, etc., as a combination of such semiconductor materials. Furthermore, N or Sb may be added thereto like GaAsN/GaInP, GaInNAs/GaInP, GaAsSb/GaInP, etc.

As described above, it may be possible to form plural surface-emitting lasers for emitting light with different wavelengths on one substrate 101 in the surface-emitting laser element in the present embodiment. Thereby, even if a variation in a film thickness of a semiconductor layer, etc., is caused in manufacturing a surface-emitting laser element, one emitting light with a wavelength closest to a desired wavelength is selected among the first surface-emitting laser 151 to the fourth surface-emitting laser 154 whereby it may be possible to obtain a semiconductor laser with a desired wavelength easily. Thereby, it may be possible to manufacture a surface-emitting laser element having a surface-emitting laser emitting light with a predetermined wavelength at a low cost.

Additionally, a contents) other than as described above is/are similar to the first embodiment.

[Third Embodiment]

Figure 14:
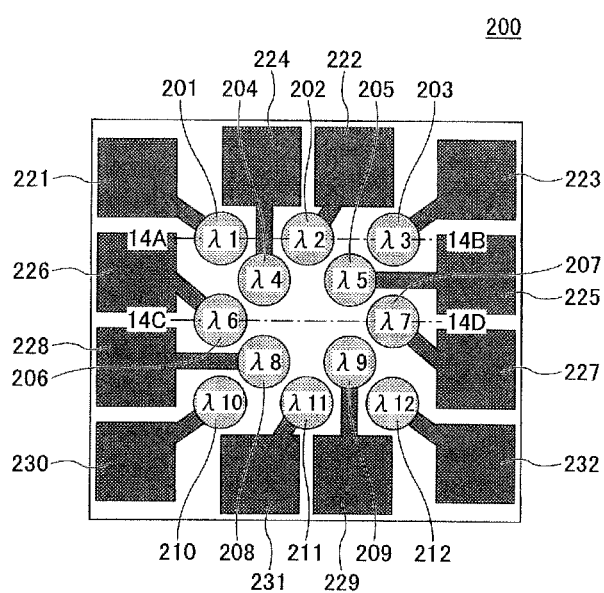
FIG. 14 is a top view of a surface-emitting laser element in a third embodiment.
Figure 15A:
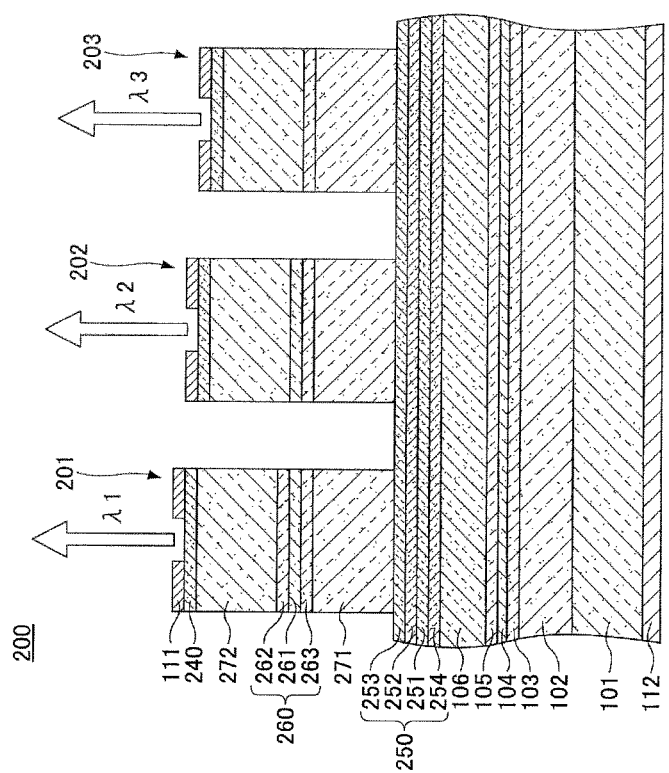
FIG. 15A and FIG. 15B are illustration diagrams of a surface-emitting laser element in a third embodiment.
Figure 15B:
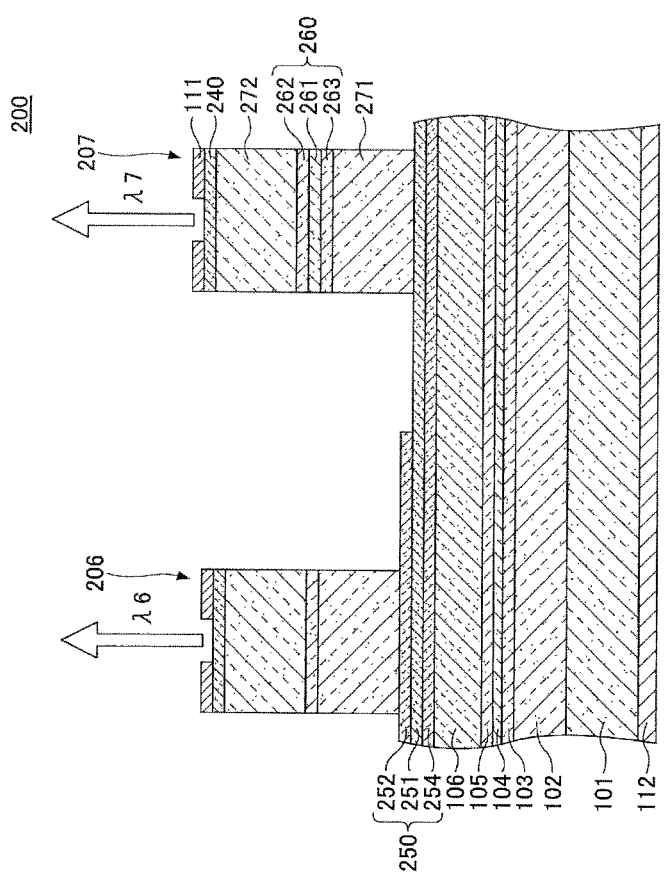

Next, a third embodiment will be described. A surface-emitting laser in the present embodiment is a 12-channel surface-emitting laser for a wavelength of 780 nm and will be described based on FIG. 14 and FIG. 15. Additionally, FIG. 14 is a top view of a surface-emitting laser in the present embodiment, while FIG. 15A is a cross-section diagram provided by cutting along a dashed dotted line 14A-14B in FIG. 14 and FIG. 15B is a cross-section diagram provided by cutting along a dashed dotted line 14C-14D in FIG. 14.

A surface-emitting laser element 200 in the present embodiment is formed on a 300 μm square semiconductor chip, wherein each of the first surface-emitting laser 201, second surface-emitting laser 202, third surface-emitting laser 203, fourth surface-emitting laser 204, fifth surface-emitting laser 205, sixth surface-emitting laser 206, seventh surface-emitting laser 207, eighth surface-emitting laser 208, ninth surface-emitting laser 209, tenth surface-emitting laser 210, eleventh surface-emitting laser 211, and twelfth surface-emitting laser 212 formed on such a semiconductor chip is connected to an electrode pad provided to correspond thereto.

Specifically, an electrode pad 221 is connected to the first surface-emitting Laser 201, an electrode pad 222 is connected to the second surface-emitting laser 202, an electrode pad 223 is connected to the third surface-emitting laser 203, an electrode pad 224 is connected to the fourth surface-emitting laser 204, an electrode pad 225 is connected to the fifth surface-emitting laser 205, an electrode pad 226 is connected to the sixth surface-emitting laser 206, an electrode pad 227 is connected to the seventh surface-emitting laser 207, an electrode pad 228 is connected to the eighth surface-emitting laser 208, an electrode pad 229 is connected to the ninth surface-emitting laser 209, an electrode pad 230 is connected to the tenth surface-emitting laser 210, an electrode pad 231 is connected to the eleventh surface-emitting laser 211, and an electrode pad 232 is connected to the twelfth surface-emitting laser 212.

Furthermore, the first surface-emitting laser 201, the second surface-emitting laser 202, the third surface-emitting laser 203, the fourth surface-emitting laser 204, the fifth surface-emitting laser 205, the sixth surface-emitting laser 206, the seventh surface-emitting laser 207, the eighth surface-emitting laser 208, the ninth surface-emitting laser 209, the tenth surface-emitting laser 210, the eleventh surface-emitting laser 211, and the twelfth surface-emitting laser 212 provide emitted light with mutually different wavelengths. Namely, a wavelength $\lambda 1$ emitted from the first surface-emitting laser 201, a wavelength $\lambda 2$ emitted from the second surface-emitting laser 202, a wavelength $\lambda 3$ emitted from the third surface-emitting laser 203, a wavelength $\lambda 4$ emitted from the fourth surface-emitting laser 204, a wavelength $\lambda 5$ emitted from the fifth surface-emitting laser 205, a wavelength $\lambda 6$ emitted from the sixth surface-emitting laser 206, a wavelength $\lambda 7$ emitted from the seventh surface-emitting laser 207, a wavelength $\lambda 8$ emitted from the eighth surface-emitting laser 208, a wavelength $\lambda 9$ emitted from the ninth surface-emitting laser 209, a wavelength $\lambda 10$ emitted from the tenth surface-emitting laser 210, a wavelength $\lambda 11$ emitted from the eleventh surface-emitting laser 211, and a wavelength $\lambda 12$ emitted from the twelfth surface-emitting laser 212 are mutually different wavelengths.

For the surface-emitting laser element in the present embodiment, a lower Bragg reflector 102, a lower spacer layer 103, an active layer 104, an upper spacer layer 105, a first upper Bragg reflector 106 are formed on a substrate 101 made of a semiconductor, etc., and a first wavelength adjustment layer 250, a second upper Bragg reflector 271, a second wavelength adjustment layer 260, a third upper Bragg reflector 272, a contact layer 240, and an upper electrode 111 are formed on the first upper Bragg reflector 106. Furthermore, the contact layer 240 is connected to the upper electrode 111 and a lower electrode 112 is formed on a back face of the substrate 101. Additionally, in the present embodiment, the lower Bragg reflector 102, lower spacer layer 103, active layer 104, upper spacer layer 105, first upper Bragg reflector 106, first wavelength adjustment layer 250, second upper Bragg reflector 271, second wavelength adjustment layer 260, third upper Bragg reflector 272, and contact layer 240, which are semiconductor layers formed on the substrate 101, are formed by epitaxially growing semiconductor materials. Specifically, such semiconductor layers are formed by epitaxial growth in MOCVD or MBE. Additionally, in the present embodiment, an upper Bragg reflector is composed of the first upper Bragg reflector 106, first wavelength adjustment layer 250, second upper Bragg reflector 271, second wavelength adjustment layer 260, and third upper Bragg reflector 272. Furthermore, the first wavelength adjustment layer 250 and the second wavelength adjustment layer 260 may be formed inside the lower Bragg reflector 102.

In the present embodiment, en n-GaAs substrate is used for the substrate 101. Furthermore, the lower Bragg reflector 102 is formed by laminating 35.5 pairs of an n-$Al_{0.1}Ga_{0.9}As$ high refractive index layer and n-$Al_{0.9}Ga_{0.1}As$ low refractive index layer in such a manner that an optical film thickness of each layer is $\lambda/4$.

The active layer 104 composed of a GaInAs quantum well layer/a GaInPAs barrier layer is formed on the lower Bragg reflector 102 through the lower spacer layer 103 made of $Al_{0.2}Ga_{0.8}As$. The upper spacer layer 105 made of $Al_{0.2}Ga_{0.8}As$ and the first upper Bragg reflector 106 are formed on the active layer 104. Additionally, a resonator area provided with an optical thickness of one wavelength is composed of the lower spacer layer 103, the active layer 104, and the upper spacer layer 105.

The first upper Bragg reflector 106 is formed by laminating 3.5 pairs of an n-$Al_{0.1}Ga_{0.9}As$ high refractive index layer and an n-$Al_{0.9}Ga_{0.1}As$ low refractive index layer in such a manner that an optical film thickness of each layer is $\lambda/4$. Additionally, one of low refractive index layers of the first upper Bragg reflector 106 is composed of an electric current narrowing layer 108 made of AlAs which is not illustrated in FIG. 15A and FIG. 15B.

The first wavelength adjustment layer 250 is formed on the first upper Bragg reflector 106. The first wavelength adjustment layer 250 is formed by laminating a phase adjustment area 254 made of p-$Al_{0.1}Ga_{0.9}As$, a first adjustment layer 251 made of GaInP, a second adjustment layer 252 made of GaAsP, and a third adjustment layer 253 made of GaInP.

The second upper Bragg reflector 271 is formed on the first wavelength adjustment layer 250. The second upper Bragg reflector 271 is formed by laminating 4.5 pairs of an n-$Al_{0.1}Ga_{0.9}As$ high refractive index layer and an n-$Al_{0.9}Ga_{0.1}As$ low refractive index layer in such a manner that an optical film thickness of each layer is $\lambda/4$.

The second wavelength adjustment layer 260 is formed on the second upper Bragg reflector 271. The second wavelength adjustment layer 260 is formed by laminating a phase adjustment area 263 made of p-$Al_{0.1}Ga_{0.9}As$, a fourth adjustment layer 261 made of GaInP, and a filth adjustment layer 262 made of GaAsP.

The third upper Bragg reflector 272 is formed on the second wavelength adjustment layer 260. The third upper Bragg reflector 272 is formed by laminating 17 pairs of an n-$Al_{0.1}Ga_{0.9}As$ high refractive index layer and an n-$Al_{0.9}Ga_{0.1}As$ low refractive index layer in such a manner that an optical film thickness of each layer is $\lambda/4$.

The contact layer 240 made of p-GaAs is formed on the third upper Bragg reflector 272, while the upper electrode 111 is formed on the contact layer 240 and the lower electrode 112 is formed on a back side of the substrate 101.

In the present embodiment, each surface-emitting laser is formed in such a manner that the first wavelength adjustment layer 250 and the second wavelength adjustment layer 260 have different thicknesses for each channel to correspond thereto. Additionally, it may be possible to form the first wavelength adjustment layer 250 and second adjustment layer 260 with different thicknesses by a method similar to the first embodiment. Specifically, it may be possible to conduct formation by conducting lithography and selective etching in such a manner that the numbers of a layer(s) in the wavelength adjustment layers are different. For example, when GaAsP (similar for a case of GaAs) is etched, it may be possible to use a mixed fluid of sulfuric acid, hydrogen peroxide, and water, and when GaInP is etched, it may be possible to use a mixed fluid of hydrochloric acid and water. After selective etching of the first wavelength adjustment layer 250 is conducted, the second upper Bragg reflector 271 and the second wavelength adjustment layer 260 are formed by crystal growth, then selective etching of the second wavelength adjustment layer 260 is conducted, and the third upper BBB 272 and contact layer 240 are formed by crystal growth. Additionally, etching of a mesa necessary for formation of each surface-emitting laser is conducted by dry etching. Additionally, the upper electrode 111 which is a p-side electrode of each surface-emitting laser is formed on the contact layer 240, and the lower electrode 112 which is an n-side common electrode is formed on a back face of the substrate 101, as illustrated in FIG. 15A and FIG. 15B. The surface-emitting laser element in the present embodiment emits laser light at an opposite side of the substrate 101.

In Japanese Patent No. 2751814, a wavelength adjustment layer is formed in a resonator area having an optical thickness of one wavelength. For example, in such a case, if a central wavelength is 780 nm and a wavelength interval is 3 nm, one layer composing the wavelength adjustment layer is provided with 0.9 nm. Such a thickness corresponds to about three atomic layers and it may be difficult to conduct uniform formation on a wafer surface with a current crystal growth technique. Furthermore, if a resonator area with an optical length of an X wavelength (X=2, 3, . . . ) is provided, a film thickness may increase to be 0.9×X nm for one layer composing the wavelength adjustment layer, but in such a case, a relaxation oscillation wavelength may degrade by $X^{-1/2}$ times so that an adverse effect may occur that an operation for high speed modulation may be difficult, etc.

On the other hand, in a surface-emitting laser element in the present embodiment, the first upper Bragg reflector 106 is formed between a resonator area and the wavelength adjustment layer 250 as illustrated in FIG. 15A and FIG. 15B. Specifically, the first upper Bragg reflector 106 is formed alternately laminating 4.5 pairs of a p-$Al_{0.1}Ga_{0.9}As$ high refractive index layer and an n-$Al_{0.9}Ga_{0.1}As$ low refractive index layer between the first wavelength adjustment, layer 250 and the resonator area. In such a case, even when an interval of an oscillation wavelength between different light-emitting elements is 3 nm, film thicknesses of GaInP/GaAsP/GaInP composing the first wavelength adjustment layer 250 are 11.6 nm/11.6 nm/11.6 nm, respectively, wherein it may be possible to conduct sufficiently uniform manufacturing on a current crystal growth technique. Hence, it may be possible to reduce a deviation of a wavelength interval between the surface-emitting lasers.

Figure 16:
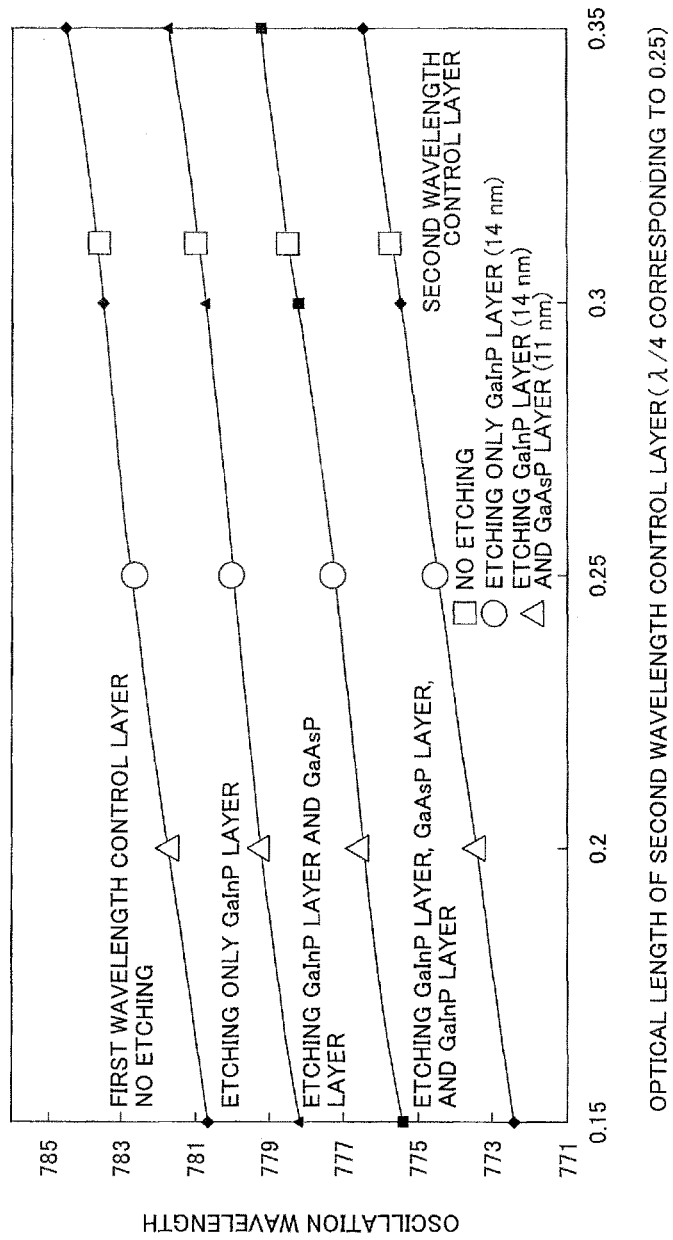
FIG. 16 is a correlation diagram between a first wavelength adjustment layer and second wavelength adjustment layer and an oscillation wavelength.

Furthermore, the second upper Bragg reflector 271 and the second wavelength adjustment layer 260 are further formed on the first wavelength adjustment layer 250. Thereby, it may be possible to form the first wavelength adjustment layer 250 more uniformly while an interval of an oscillation wavelength is narrowed. FIG. 16 illustrates a relationship between film thicknesses of the first wavelength adjustment layer 250 and second wavelength adjustment layer 260 (as indicated by optical film thicknesses, wherein λ/4 is referred to as 0.25) and an oscillation wavelength in the surface-emitting laser element in the present embodiment as illustrated in FIG. 14 and FIGS. 15A and 15B.

Additionally, it may be possible to change a film thickness of the first wavelength adjustment layer 250 by conducting selective etching of GaInP/GaAsP/GaInP making the first wavelength adjustment layer 250. Similarly, it may be possible to change a film thickness of the second wavelength adjustment layer 260 by conducting selective etching of GaInP GaAsP making the second wavelength adjustment layer 260.

As illustrated in FIG. 16, when a film thickness of the second wavelength adjustment layer 260 is constant, a film thickness of the first wavelength adjustment layer 250 may be changed, that is, GaInP/GaAsP/GaInP with 11.6 nm/11.6 nm/11.6 nm forming the first wavelength adjustment layer 250 may be etched one by one, so that it may be possible to obtain an oscillation wavelength-change of about 3 nm. Furthermore, when a film thickness of the first wavelength adjustment layer 250 is constant, a film thickness of the second wavelength adjustment layer 260 may be changed, that is, GaInP/GaAsP with 14 nm/11 nm forming the second wavelength adjustment layer 260 may be etched one by one, so that it may be possible to obtain an oscillation wavelength change of about 1 nm. Thus, as illustrated in FIG. 15A and FIG. 15B, film thicknesses of the first wavelength adjustment layer 250 and second wavelength adjustment layer 260 may be changed by 4 levels and 3 levels, respectively, whereby it may be possible to form a surface-emitting laser with different oscillation wavelengths at 4×3=12 levels. Furthermore, film thicknesses of the first wavelength adjustment layer 250 and second wavelength adjustment layer 260 may be adjusted as illustrated in FIG. 16, whereby it may be possible for all of twelve surface-emitting lasers to oscillate at different wavelengths with an interval of about 1 nm.

Next, the phase adjustment area 254 formed on the first wavelength adjustment layer 250 will be described. A reflectance is illustrated in FIG. 17B in a case where the first adjustment layer 251, the second adjustment layer 252, and the third adjustment layer 253 are formed without forming the phase adjustment area 254 as illustrated in FIG. 17A wherein each layer of GaInP/GaAsP/GaInP is removed by wet etching. As illustrated in FIG. 17B, if the phase adjustment area 254 is not formed, a reflectance may be greatly changed by changing a thickness of the first wavelength adjustment layer 250. Such a matter may mean that a deviation of a laser characteristic such as a threshold electric current for each wavelength may increase.

Figure 18B:
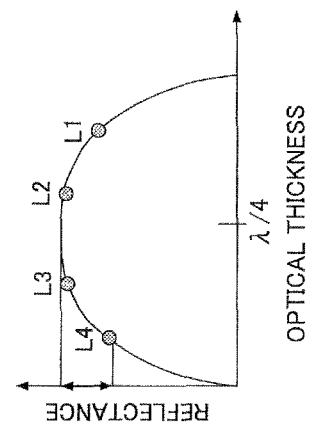
FIG. 18A and FIG. 18B are illustration diagrams (2) of a first wavelength adjustment layer of a surface-emitting laser element in a third embodiment.
Figure 18A:
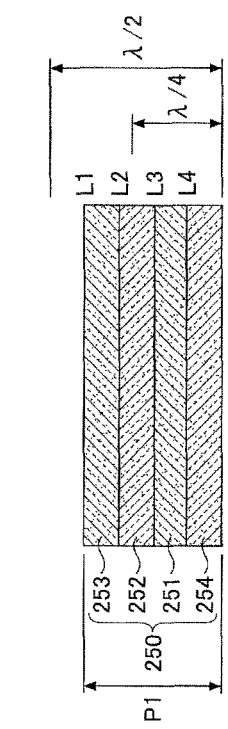

On the other hand, the phase adjustment area 254 is formed on the first wavelength adjustment layer 250 as illustrated in FIG. 18A, whereby it may be possible to make a position at which an optical thickness of the first wavelength adjustment layer 250 is λ/4 be a position at which the first adjustment layer 252 made of GaAsP is formed. Thereby, it may be possible to reduce a change of a reflectance as illustrated in FIG. 18B.

That is, it is preferable for an optical thickness P1 of the first wavelength adjustment layer 250 to be λ/4≤P1<λ/2, and when such a matter is generalized, (2N−1)λ/4≤P1<2Nλ/4 is preferable. Additionally, N is a positive integer.

Furthermore, it is preferable to conduct formation in such a manner that, when the layer number of a formed film(s) (an adjustment layer(s)) is M (wherein M is a positive integer), a position at which an optical film thickness of the first wavelength adjustment layer 250 is λ/4 is an (M+1)/2 th film (adjustment layer) from a top thereof in a case where M is an odd number or an M/2 th or (M/2)+1 th film (adjustment layer) from a top thereof in a case where M is an even number.

As illustrated in FIG. 19A, the phase adjustment area 254 may be made of p-$Al_{0.1}Ga_{0.9}As$, and as illustrated in FIG. 19B, a phase adjustment area 254a may be formed by alternately laminating GaInP and GaAsP. Additionally, although the first wavelength adjustment layer 250 has been described above, similar matter(s) also applies (apply) to the second wavelength adjustment layer 260.

Meanwhile, for a wavelength adjustment layer, Japanese Patent Application Publication No. 11-330631 may disclose a combination of AlGaAs and InGaP and Japanese Patent No. 2751814 may disclose a combination of GaAs and AlGaAs. Both use AlGaAs including Al but there may be a problem in reliability because Al is included and accordingly corrosion such as oxidation may be readily caused. In particular, when crystal growth of a semiconductor layer is conducted after etching of a wavelength adjustment layer as in the present embodiment, a surface of a wavelength adjustment layer contacts atmosphere in a manufacturing process, and hence, a surface of Al may be oxidized so that it may be extremely difficult to conduct crystal growth for an upper Bragg reflector thereon. On the other hand, the wavelength adjustment layer is made of GaInP and GaAsP which include no Al in the surface-emitting laser element in the present embodiment, differently from Japanese Patent No. 2751814 or Japanese Patent Application Publication No. 11-330631, whereby it may be possible to extremely delay progression of corrosion in a manufacturing process and it may be possible to obtain a high reliability.

Additionally, although a case of a combination of GaAsP and GaInP has been described in the description(s) for the present embodiment, there may be provided a combination with another material including no Al which is further provided for a different etching fluid and is a semiconductor material with a band gap energy greater than an oscillation wavelength. In a case of 780 nm which is an oscillation wavelength in the present embodiment, it may be possible to provide, for example, GaInAsP/GaInP, GaAsP/GaInAsP, etc., as such a combination of semiconductor materials. Furthermore, it may also be possible to use GaAs instead of GaAsP in a wavelength which is a long wavelength of 1 µm or greater. In such a case, distortion like GaAsP may not be provided for a GaAs substrate, and hence, it may be easy to handle.

Additionally, a content(s) other than as described above is/are similar to the first embodiment.

[Fourth Embodiment]

Figure 20:
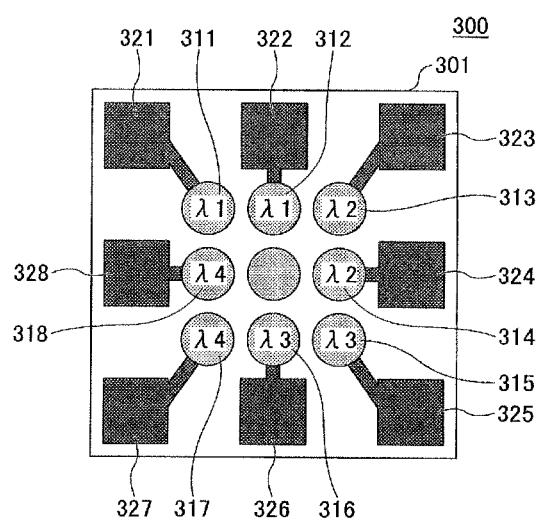
FIG. 20 is a top view of a surface-emitting laser element in a fourth embodiment.

Next, a fourth embodiment will be described. A surface-emitting laser element in the present embodiment will be described based on FIG. 20. A surface-emitting laser element 300 in the present embodiment has eight surface-emitting lasers on a substrate 301, wherein surface-emitting lasers with conducting emission at different wavelengths due to the first to third embodiments are formed, and furthermore, surface-emitting lasers emitting light with an identical wavelength are formed two by two.

Specifically, the surface-emitting laser element 300 in the present embodiment has a first surface-emitting laser 311, second surface-emitting laser 312, third surface-emitting laser 313, fourth surface-emitting laser 314, fifth surface-emitting laser 315, sixth surface-emitting laser 316, seventh surface-emitting laser 317, and eighth surface-emitting laser 318 on the substrate 301. Each of the surface-emitting laser 311 to the eighth surface-emitting laser 318 is connected to an electrode pad. Specifically, an electrode pad 321 is connected to the first surface-emitting laser 311, an electrode pad 322 is connected to the second surface-emitting laser 312, an electrode pad 322 is connected to the third surface-emitting laser 313, and an electrode pad 324 is connected to the fourth surface-emitting laser 314, while an electrode pad 325 is connected to the fifth surface-emitting laser 315, an electrode pad 326 is connected to the sixth surface-emitting laser 316, an electrode pad 327 is connected to the seventh surface-emitting laser 317, and an electrode pad 328 is connected to the eighth surface-emitting laser 318.

Furthermore, the first surface-emitting laser 311 to the eighth surface-emitting laser 318 are formed in such a manner that ones for an identical wavelength are provided two by two. Specifically, light emitted from the first surface-emitting laser 311 and second surface-emitting laser 312 have an identical wavelength of $\lambda 1$ and light emitted from the third surface-emitting laser 313 and fourth surface-emitting laser 314 have an identical wavelength of $\lambda 2$ while light emitted from the fifth surface-emitting laser 315 and sixth surface-emitting laser 316 have an identical wavelength of $\lambda 3$ and light emitted from the seventh surface-emitting laser 317 and eighth surface-emitting laser 318 have an identical wavelength of $\lambda 4$, wherein wavelengths $\lambda 1$ to $\lambda 4$ are mutually different wavelengths. Thus, in order to emit light with a different wavelength in each surface-emitting laser, a wavelength adjustment layer is provided similarly to the first embodiment, and formed in such a manner that a thickness of a wavelength adjustment layer is changed for each surface-emitting laser. Additionally, a size of each of the electrode pads 321 to 328 is about 50 µm square, and the substrate 301 is a semiconductor chip with a size of 300 µm square.

In the surface-emitting laser element in the present embodiment, surface-emitting lasers for emitting light with an identical wavelength are present two by two, whereby even if one of surface-emitting lasers for emitting light with an identical wavelength does emit light due to a failure, a trouble, etc., it may be possible to use the other. Hence, it may be possible for a lifetime of a surface-emitting laser element to be a longer lifetime and it may be possible to further improve a yield thereof. Furthermore, in the surface-emitting laser element in the present embodiment, not only an element with a wavelength closest to a necessary wavelength but also an element with a second closest wavelength may be used, and such an element may be used as a preparatory surface-emitting laser whereby it may be possible to attain a longer lifetime.

Additionally, a content(s) other than as described above is/are similar to the first to third embodiments.

[Fifth Embodiment]

Figure 21:
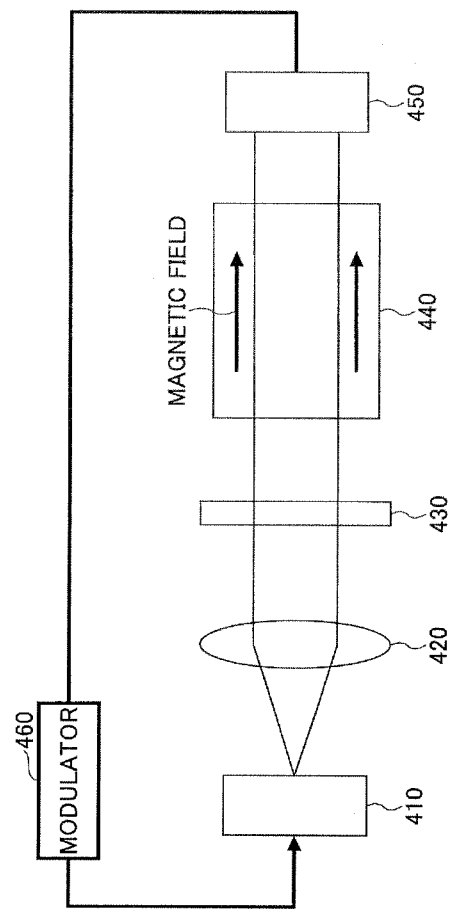
FIG. 21 is a structural diagram of an atomic oscillator in a fifth embodiment.

Next, a fifth embodiment will be described. The present embodiment is an atomic oscillator using the surface-emitting laser element in the first to fourth embodiments. The atomic oscillator in the present embodiment will be described based on FIG. 21. The atomic oscillator in the present embodiment is a CPT-type compact atomic oscillator and has a light source 410, a collimating lens 420, a $\lambda/4$ wave plate 430, an alkali metal cell 440, a photodetector 450, and a modulator 460.

For the light source 410, the surface-emitting laser element in the first to fourth embodiments is used. For the alkali metal cell 440, Cs (cesium) atomic gas is enclosed as an alkali metal therein, wherein transition of the D1 line is used. For the photodetector 450, a photodiode is used.

In the atomic oscillator in the present embodiment, the alkali metal cell 440 in which a cesium atomic gas is enclosed is radiated with light emitted from the light source 410 so that an electron of a cesium atom is excited. Light having transmitted through the alkali metal cell 440 is detected by the photodetector 450, wherein a signal detected by the photodetector 450 is fed back to the modulator 460 and the surface-emitting laser element in the light source 410 is modulated by the modulator 460.

Figure 22:
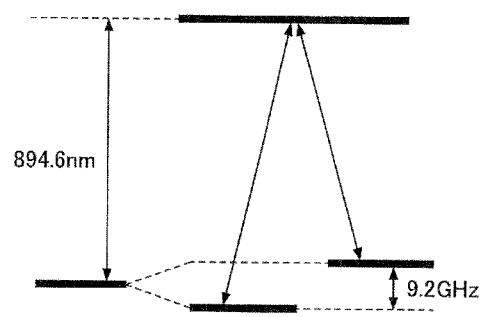
FIG. 22 is an illustration diagram of an atomic energy level for illustrating a CPT type.
Figure 23:
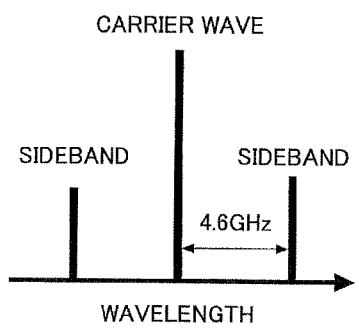
FIG. 23 is an illustration diagram of an output wavelength at time of modulation of a surface-emitting laser.
Figure 24:
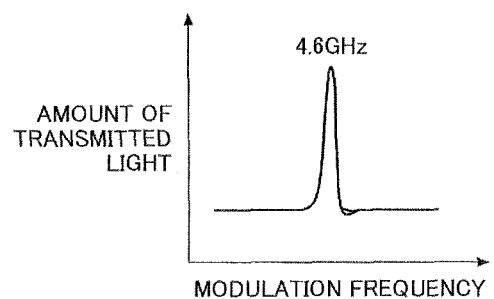
FIG. 24 is a correlation diagram between a modulation frequency and an amount of transmitted light.

FIG. 22 illustrates a configuration of atomic energy levels associated with CPT. A fact is utilized that an absorption ratio of light decreases when electrons are simultaneously excited from two ground levels to an excited level. For the surface-emitting laser, an element with a wavelength of a carrier wave which is close to 894.6 nm is used. It may be possible to conduct tuning of a wavelength of a carrier wave by changing a temperature or output of the surface-emitting laser. When a temperature or an output is raised, a shift to a longer wavelength may be caused, wherein a variation in a light density of an alkali metal cell is not preferable and hence it is preferable to utilize a temperature change. Specifically, it may be possible to adjust a temperature dependency of a wavelength at about 0.05 nm/° C. As illustrated in FIG. 23, modulation is conducted to generate sidebands at both sides of a carrier wave, wherein modulation is conducted at 4.6 GHz in such a manner that a frequency difference may coincide with 9.2 GHz which is an eigenfrequency of a Cs atom. As illustrated in FIG. 24, laser light passing through an excited Cs gas is maximum at a time when a sideband frequency difference coincides with an eigenfrequency difference of a Cs atom, and hence, a modulation frequency of the surface-emitting laser element in the light source 410 is adjusted by conducting feed back in the modulator 460 in such a manner that an output from the photodetector 450 may hold a maximum value. Because an eigenfrequency of an atom may be extremely stable, a modulation frequency is a stable value so that such information is obtained as an output. Additionally, when a wavelength is 894.6 nm, a light source with a wavelength range of ±1 nm may be needed. That is, a light source with a wavelength range of 893.6 nm-895.6 nm may be needed.

The surface-emitting laser element in the first to fourth embodiments is used in the atomic oscillator in the present embodiment, and hence, it may be possible to manufacture and provide an atomic oscillator at a low cost. Furthermore, the surface-emitting laser element in the third embodiment and/or fourth embodiment is used, and hence, it may be possible to further provide an atomic oscillator with a longer lifetime.

Furthermore, although Cs is used as an alkali metal in the present embodiment and a surface-emitting laser for a wavelength of 894.6 nm is used to use transition of the D1 line thereof, it may also be possible to use 852.3 nm in a case where the D2 line of Cs is utilized. Furthermore, it may also be possible to use Rb (rubidium) as an alkali metal, wherein it may be possible to use 795.0 nm in a case where the D1 line is utilized or 780.2 nm in a case where the D2 line is utilized. It may be possible to design a material composition of an active layer, etc., depending on a wavelength. Furthermore, for a modulation frequency in a case where Rb is used, modulation is conducted at 3.4 GHz for $^{87}$Rb or 1.5 GHz for $^{85}$Rb. Additionally, even for such wavelengths, a light source with a wavelength range of ±1 nm may be needed. That is, when the D2 line of Cs is utilized, a light source with a wavelength range of 851.3 nm-853.3 nm may be needed. Furthermore, when the D1 line of Rb is utilized, a light source with a wavelength range of 794.0 nm-796.0 nm may be needed. Furthermore, when the D2 line of Rb is utilized, a light source with a wavelength range of 779.2 nm-781.2 nm may be needed.

Although some embodiments of the present invention have been described above, the content(s) of the invention is/are not limited to the aforementioned content(s). Furthermore, although a case where a surface-emitting laser element is used for an atomic oscillator has been described in some embodiments of the present invention, it may be possible to use the surface-emitting laser element in the first to fourth embodiments for another device in need of light with a predetermined wavelength such as a gas sensor, etc. In such a case, a surface-emitting laser for light with a predetermined wavelength corresponding to an application thereof is also used in such a device, whereby it may be possible to obtain a similar effect.

[Appendix]

<An Illustrative Embodiment(s) of a Surface-Emitting Laser Element, a Method for Manufacturing a Surface-Emitting Laser Element, and an Atomic Oscillator>

At least one illustrative embodiment of the present invention may relate to a surface-emitting laser element, a method for manufacturing a surface-emitting laser element, and an atomic oscillator.

An object of at least one illustrative embodiment of the present invention may be to provide a surface-emitting laser element having plural surface-emitting lasers capable of oscillating more accurately at a desired wavelength interval.

At least one illustrative embodiment of the present invention may be characterized by having plural surface-emitting lasers having a lower Bragg reflector formed on a semiconductor substrate, a resonator including an active layer formed on the lower Bragg refection mirror, and an upper Bragg reflector formed on the resonator, wherein a wavelength adjustment layer is formed in the upper Bragg reflector or lower Bragg reflector, wherein emission therefrom is provided at different wavelengths respectively by changing a thickness of the wavelength adjustment layer, wherein the wavelength adjustment layer is formed by laminating respective adjustment layers made of two kinds of different materials, and wherein a thickness of the wavelength adjustment layer is changed by changing a layer number of the adjustment layers in the wavelength adjustment layer.

Furthermore, at least one illustrative embodiment of the present invention may be characterized by a method for manufacturing a surface-emitting laser element having plural surface-emitting lasers having a lower Bragg reflector formed on a semiconductor substrate, a resonator including an active layer formed on the lower Bragg refection mirror, and an upper Bragg reflector formed on the resonator, wherein a wavelength adjustment layer is formed in the upper Bragg reflector or lower Bragg reflector, wherein emission therefrom is provided at different wavelengths respectively by changing a thickness of the wavelength adjustment layer, wherein the wavelength adjustment layer is formed by laminating respective adjustment layers made of two kinds of different materials, and wherein a thickness of the wavelength adjustment layer is changed by removing the adjustment layer(s) in the it wavelength adjustment layer for each of the adjustment layer to change a layer number thereof, which has a step of removing one adjustment layer by a first etching fluid among respective adjustment layers made of two kinds of different materials in the wavelength adjustment layer and a step of removing the other adjustment layer by a second etching fluid among respective adjustment layers made of two kinds of different materials in the wavelength adjustment layer, wherein the first etching fluid and the second etching fluid are different therefrom.

Illustrative embodiment (1) is a surface-emitting laser element characterized by having plural surface-emitting lasers having a lower Bragg reflector formed on a semiconductor substrate, a resonator including an active layer formed on the lower Bragg reflector, and an upper Bragg reflector formed on the resonator, wherein a wavelength adjustment layer is formed in the upper Bragg reflector or lower Bragg reflector, wherein emission therefrom is provided at different wavelengths respectively by changing a thickness of the wavelength adjustment layer, wherein the wavelength adjustment layer is formed by laminating respective adjustment layers made of two kinds of different materials, and wherein a thickness of the wavelength adjustment layer is changed by changing a layer number of the adjustment layers in the wavelength adjustment layers.

Illustrative embodiment (2) is the surface-emitting laser element as described in illustrative embodiment (1), characterized in that an optical thickness P of the wavelength adjustment layer is $(2N-1)\lambda/4 \leq P < N\lambda/2$, wherein $\lambda$ is a wavelength of the surface-emitting laser and N is a positive integer.

Illustrative embodiment (3) is the surface-emitting laser element as described in illustrative embodiment (1) or (2), characterized in that M layers (M is a positive integer) of the adjustment layers are formed in the wavelength adjustment layer, wherein a position at which an optical film thickness of the wavelength adjustment layer is $\lambda/4$ from a side at which the active layer is provided is an (M+1)/2 th adjustment layer from a top thereof in a case where M is an odd number or an M/2 th or (M/2)+1 th adjustment layer from a top thereof in a case where M is an even number.

Illustrative embodiment (4) is the surface-emitting laser element as described in any of illustrative embodiments (1) to (3), characterized in that the wavelength adjustment layer is composed of a wavelength adjustment area and a phase adjustment area, wherein the wavelength adjustment area is composed of respective adjustment layers made of two kinds of different materials.

Illustrative embodiment (5) is the surface-emitting laser element as described in illustrative embodiment (4), characterized in that the wavelength adjustment layer includes a contact layer formed at a side nearer the resonator than the wavelength adjustment area, wherein the contact layer is connected to one electrode.

Illustrative embodiment (6) is the surface-emitting laser element as described in any of illustrative embodiments (1) to (5), characterized in that a set of the wavelength adjustment layers is formed.

Illustrative embodiment (7) is the surface-emitting laser element as described in any of illustrative embodiments (1) to (6), characterized in that a set of the wavelength adjustment layers is formed in the upper Bragg reflector.

Illustrative embodiment (8) is the surface-emitting laser element as described in any of illustrative embodiments (1) to (7), characterized in that a film thickness of the wavelength adjustment layer is changed by conducting removal of the adjustment layer in the wavelength adjustment layer, wherein one adjustment layer among respective adjustment layers made of two kinds of different materials in the wavelength adjustment layer is removed by a first etching fluid and the other adjustment layer is removed by a second etching fluid, wherein the first etching fluid and the second etching fluid are different therefrom.

Illustrative embodiment (9) is the surface-emitting laser element as described in any of illustrative embodiments (1) to (8), characterized in that one adjustment layer among respective adjustment layers made of two kinds of different materials in the wavelength adjustment layer is made of GaInP and the other adjustment layer is made of GaAsP or GaAs.

Illustrative embodiment (10) is the surface-emitting laser element as described in any of illustrative embodiments (1) to (9), characterized in that the upper Bragg reflector includes a first upper Bragg reflector, a wavelength adjustment layer, and a second upper Bragg reflector formed in order from a side at which the active layer is formed, wherein the second upper Bragg reflector is formed by alternately laminating and forming dielectrics with different refractive indices.

Illustrative embodiment (11) is the surface-emitting laser element as described in any of illustrative embodiments (1) to (10), characterized in that at least one of the plural wavelengths is included in a range of 893.6 nm-895.6 nm, 851.3 nm-853.3 nm, 794.0 nm-796.0 nm, or 779.2 nm-781.2 nm.

Illustrative embodiment (12) is a method for manufacturing a surface-emitting laser element having plural surface-emitting lasers having a lower Bragg reflector formed on a semiconductor substrate, a resonator including an active layer formed on the lower Bragg reflector, and an upper Bragg reflector formed on the resonator, wherein a wavelength adjustment layer is formed in the upper Bragg reflector or lower Bragg reflector, wherein emission therefrom is provided at different wavelengths respectively by changing a thickness of the wavelength adjustment layer, wherein the wavelength adjustment layer is formed by laminating respective adjustment layers made of two kinds of different materials, and wherein a thickness of the wavelength adjustment layer is changed by removing the adjustment layers) in the wavelength adjustment layer for each of the adjustment layer to change a layer number thereof, characterized by having a step of removing one adjustment layer by a first etching fluid among respective adjustment layers made of two kinds of different materials in the wavelength adjustment layer and a step of removing the other adjustment layer by a second etching fluid among respective adjustment layers made of two kinds of different materials in the wavelength adjustment layer, wherein the first etching fluid and the second etching fluid are different therefrom.

Illustrative embodiment (13) is the method for manufacturing a surface-emitting laser element as described in illustrative embodiment (12), characterized in that one adjustment layer among respective adjustment layers made of two kinds of different materials in the wavelength adjustment layer is made of GaInP and the other adjustment layer is made of GaAsP or GaAs.

Illustrative embodiment (14) is the method for manufacturing a surface-emitting laser element as described in either illustrative embodiment (12) or (13), characterized in that the upper Bragg reflection layer includes a first upper Bragg reflector, a wavelength adjustment layer, and a second Bragg reflector formed in order from a side at which the active layer is formed, wherein the second upper Bragg reflector is formed by alternately laminating and forming dielectrics with different refractive indices.

Illustrative embodiment (15) is an atomic oscillator characterized by having the surface-emitting laser element as described in any of illustrative embodiments (1) to (11), an alkali metal cell enclosing an alkali metal, and a photodetector for detecting light having transmitted through the alkali metal cell among light irradiating the alkali metal cell from a surface emitting laser in the surface-emitting laser element, wherein light with two different wavelengths among light emitted from the surface-emitting laser and including a sideband is incident on the alkali metal cell whereby an oscillation frequency is controlled based on a light absorption characteristic caused by a quantum interference effect of two kinds of resonance light.

Illustrative embodiment (16) is the atomic oscillator as described in illustrative embodiment (15), characterized in that the alkali metal is rubidium or cesium.

According to at least one illustrative embodiment of the present invention, it may be possible to provide a surface-emitting laser element having plural surface-emitting lasers capable of oscillating more accurately at a desired wavelength interval, because it may be possible to increase a film thickness of a film forming a wavelength adjustment layer.

Although the illustrative embodiment(s) and/or specific example(s) of the present invention has/have been described with reference to the accompanying drawing(s), the present invention is not limited to any of the illustrative embodiment(s) and/or specific example(s) and the illustrative embodiment(s) and/or specific example(s) may be altered, modified, or combined without departing from the scope of the present invention.

The present application claims the benefit of priority based on Japanese Patent Application No. 2011-264908 filed on Dec. 2, 2011 and Japanese Patent Application No. 2012-234113 filed on Oct. 23, 2012, the entire content of which is hereby incorporated by reference herein.

The invention claimed is:

1. A surface-emitting laser element comprising
a semiconductor substrate and
plural surface-emitting lasers configured to emit light with mutually different wavelengths, each surface-emitting laser including
a lower Bragg reflector provided on the semiconductor substrate, a resonator provided on the lower Bragg reflector,
an upper Bragg reflector provided on the resonator,
a first region of wavelength adjustment layers and a second region of wavelength adjustment layers discontinuous from the first region of wavelength adjustment layers, the first region of wavelength adjustment layers and the second region of wavelength adjustment layers being provided inside the upper Bragg reflector or lower Bragg reflector, and the second region of wavelength adjustment layers collectively having a different thickness than that of the first region of wavelength adjustment layers,
the wavelength adjustment layers included in the surface-emitting lasers having mutually different thicknesses, at least one of the wavelength adjustment layers including three or more adjustment layers stacked one on top of another and made of at least two kinds of materials, and numbers of the adjustment layers included in the wavelength adjustment layers being mutually different.

2. The surface-emitting laser element as claimed in claim 1, wherein at least one of the wavelength adjustment layers is configured to satisfy a condition of $(2N-1)\lambda/4 \leq P < N\lambda/2$, wherein P is an optical thickness of the at least one of the wavelength adjustment layers, $\lambda$ is a wavelength of light to be emitted from each surface-emitting laser, and N is a positive integer.

3. The surface-emitting laser element as claimed in claim 1, wherein M is a number of the adjustment layers included in the at least one of the wavelength adjustment layers, and a position of an optical thickness of the at least one of the wavelength adjustment layers being $\lambda/4$ from a side of the resonator is provided in an (M+1)/2 th adjustment layer from a top of the adjustment layers in a case where M is an odd number or an M/2 th or (M/2)+1 th adjustment layer from a top of the adjustment layers in a case where M is an even number.

4. The surface-emitting laser element as claimed in claim 1, wherein at least one of the wavelength adjustment layers includes a wavelength adjustment area and a phase adjustment area and the wavelength adjustment area includes the adjustment layers made of two kinds of materials.

5. The surface-emitting laser element as claimed in claim 4, wherein at least one of the wavelength adjustment layers includes a contact layer provided at a side nearer the resonator than the wavelength adjustment area and the contact layer is connected to one electrode.

6. The surface-emitting laser element as claimed in claim 1, wherein at least one of the wavelength adjustment layers is provided in the upper Bragg reflector.

7. The surface-emitting laser element as claimed in claim 1, wherein one adjustment layer in the at least one of the wavelength adjustment layers is made of GaInP and another adjustment layer is made of GaAsP or GaAs.

8. The surface-emitting laser element as claimed in claim 1, wherein the upper Bragg reflector includes a first upper Bragg reflector, the wavelength adjustment layer, and a second upper Bragg reflector in order from a side of the resonator, and the second upper Bragg reflector is composed of alternately laminated dielectrics with different refractive indices.

9. The surface-emitting laser element as claimed in claim 1, wherein at least one of the mutually different wavelengths is included in a range of 893.6 nm to 895.6 nm, 851.3 nm to 853.3 nm, 794.0 nm to 796.0 nm, or 779.2 nm to 781.2 nm.

10. A method for manufacturing a surface-emitting laser element including plural surface-emitting lasers configured to emit light with mutually different wavelengths, comprising steps of
forming a lower Bragg reflector on a semiconductor substrate,
forming a resonator on the lower Bragg reflector,
forming an upper Bragg reflector on the resonator,
wherein (i) a first region of wavelength adjustment layers and (ii) a second region of wavelength adjustment layers discontinuous from the first region of wavelength adjustment layers are formed inside at least one of the upper Bragg reflector or lower Bragg reflector by laminating three or more adjustment layers stacked one on top of another and made of at least two kinds of materials,
removing one adjustment layer in the wavelength adjustment layer by using a first etching fluid, and
removing another adjustment layer in the wavelength adjustment layer by using a second etching fluid different from the first etching fluid, so that
the wavelength adjustment layers included in the surface-emitting lasers have mutually different thicknesses and numbers of the adjustment layers included in the wavelength adjustment layers are mutually different, and
the second region of wavelength adjustment layers collectively have a different thickness than that of the first region of wavelength adjustment layers.

11. The method for manufacturing a surface-emitting laser element as claimed in claim 10, wherein one adjustment layer in the wavelength adjustment layer is made of GaInP and another adjustment layer is made of GaAsP or GaAs.

12. The method for manufacturing a surface-emitting laser element as claimed in claim 10, wherein the upper Bragg reflection layer is formed to include a first upper Bragg reflector and a second upper Bragg reflector, wherein the first upper Bragg reflector, the wavelength adjustment layer, and the second upper Bragg reflector are formed in order from a side of the resonator, and wherein the second upper Bragg reflector is formed by alternately laminating dielectrics with different refractive indices.

13. An atomic oscillator comprising the surface-emitting laser element as claimed in claim 1, an alkali metal cell including an alkali metal to be irradiated with light emitted from the surface-emitting laser element, a photodetector configured to detect light having transmitted through the alkali metal cell, and a controller configured to control an oscillation frequency of the surface-emitting laser element based on light detected by the photodetector.

14. The atomic oscillator as described in claim 13, wherein the alkali metal includes rubidium or cesium.

* * * * *